(12) United States Patent
Kondo et al.

(10) Patent No.: US 6,858,308 B2
(45) Date of Patent: Feb. 22, 2005

(54) SEMICONDUCTOR ELEMENT, AND METHOD OF FORMING SILICON-BASED FILM

(75) Inventors: Takaharu Kondo, Kyoto (JP); Shotaro Okabe, Nara (JP); Masafumi Sano, Kyoto (JP); Akira Sakai, Kyoto (JP); Ryo Hayashi, Nara (JP); Shuichiro Sugiyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 95 days.

(21) Appl. No.: 10/092,617

(22) Filed: Mar. 8, 2002

(65) Prior Publication Data

US 2003/0075717 A1 Apr. 24, 2003

(30) Foreign Application Priority Data

Mar. 12, 2001 (JP) .................................. 2001-069353
Mar. 12, 2001 (JP) .................................. 2001-069355

(51) Int. Cl.[7] .............................. H01L 21/00; B32B 9/00
(52) U.S. Cl. ..................... 428/446; 428/448; 428/333; 136/258; 136/261; 438/489; 438/479; 438/482
(58) Field of Search .................... 428/426, 428, 428/333, 446, 448; 136/258, 261; 438/478, 479, 482

(56) References Cited

U.S. PATENT DOCUMENTS 6,103,138 A    8/2000  Kondo ...................... 252/62.3
6,166,319 A  * 12/2000  Matsuyama .................. 136/249
6,303,945 B1  10/2001  Saito et al. ................... 257/64
6,383,576 B1 *  5/2002  Matsuyama .................. 427/585

FOREIGN PATENT DOCUMENTS

| EP | 0895291 A2 | * | 2/1999 |
| JP | 11-233803 | | 8/1999 |
| JP | 11233803 A | * | 8/1999 |
| JP | 11-310495 | | 11/1999 |

* cited by examiner

Primary Examiner—Stephen Stein
(74) Attorney, Agent, or Firm—Fitzpatrick, Cella, Harper & Scinto

(57) ABSTRACT

The invention provides a semiconductor element having a semiconductor junction composed of silicon-based films, at least one of the silicon-based films containing a microcrystal. The microcrystal is located in at least one interface region of the silicon-based film containing the microcrystal and has no orientation property. Further, the invention provides a semiconductor element having a semiconductor junction composed of silicon-based films, at least one of the silicon-based films containing a microcrystal, and the orientation property of the microcrystal changing in a film thickness direction of the silicon-based film containing the microcrystal. Thereby, a silicon-based film having a shortened tact time, an increased film forming rate, and excellent characteristics, and a semiconductor element including this silicon-based film having excellent adhesion and environmental resistance can be obtained.

85 Claims, 6 Drawing Sheets

SEMICONDUCTOR ELEMENT, AND METHOD OF FORMING SILICON-BASED FILM

BACKGROUND OF THE INVENTION

1. Field of the Invention

The present invention relates to a semiconductor element comprising a semiconductor junction composed of silicon-based films, and a method of forming silicon-based films.

2. Related Background Art

When a crystal phase is contained in an i-type semiconductor layer substantially functioning as an light-absorbing layer in a photovoltaic element having a pin junction, a photodegradation phenomenon, which results from a Staebler-Wronski effect and poses a problem in the case of an amorphous semiconductor, is advantageously suppressed. Accordingly, it is effective that the i-type semiconductor layer contains a crystal phase. Further, a high-mobility TFT is required for a high-definition and high-luminance liquid crystal panel. However, a silicon TFT in a crystal phase has a higher mobility than an amorphous silicon TFT by two orders or more, so that even if TFT characteristics are substantially improved and the TFT has a significantly reduced gate width, a current value required for circuit operations is ensured and a reduced pixel pitch is obtained compared to amorphous silicon TFTs. Consequently, it becomes relatively easy to reduce the size of the apparatus and increase the definition thereof.

Under these circumstances, various attempts have been made for silicon-based thin films containing a crystal phase.

A high-frequency plasma CVD process is one of the excellent methods for enabling silicon-based thin films to be mass-produced partly because this process allows silicon-based thin films larger in area to be formed at low temperature and improves process throughput. Examples of application of silicon-based thin films to products include solar cells and color liquid crystal TFTs, but to popularize these silicon-based films, costs must be further reduced and the performance thereof increased. Thus, establishment of techniques for the high-frequency plasma CVD process is an important technical object.

As a crystal silicon-based thin film layer using a (220) face as a growth face, Japanese Patent Application Laid-Open No. 11-310495 discloses a silicon-based thin film characterized in that the (220) face has a diffraction intensity of 30% or more to the total diffraction intensity.

Further, as an example of an element with a semiconductor layer having a pin junction in which an i-type semiconductor layer is composed of microcrystalline silicon, Japanese Patent Application Laid-Open No. 11-233803 discloses a photovoltaic element wherein the orientation property of a crystal in the i-type semiconductor layer changes in a depth direction.

As described previously, the silicon-based thin films exhibit excellent characteristics. However, the former application describes a silicon-based thin film in which the crystal is preferentially oriented along the (220) face, but does not refer to the distribution of the orientation property. Further, the latter application does not refer to a silicon-based thin film in which the crystal is preferentially oriented along the (220) face.

SUMMARY OF THE INVENTION

In order to provide a more inexpensive silicon-based film showing excellent performance, it is an object of the present invention to provide a silicon-based film having a shortened tact time, an increased film forming rate, and excellent characteristics, and a semiconductor element using this silicon-based film and having excellent adhesion and environmental resistance.

The present invention provides a semiconductor element comprising a semiconductor junction composed of silicon-based films, wherein at least one of the silicon-based films contains a microcrystal, and the orientation property of the microcrystal in the silicon-based film containing the microcrystal changes in a film thickness direction of the silicon-based film containing the microcrystal.

The present invention provides a semiconductor element comprising a semiconductor junction composed of silicon-based films, at least one of the silicon-based films containing a microcrystal, wherein the silicon-based film containing the microcrystal is formed by introducing a source gas containing at least one of a hydrogenated silicon gas and a fluorinated silicon gas, and hydrogen into a vacuum vessel, introducing high frequency into a high frequency introducing section in the vacuum vessel, and using a high frequency plasma process to form a silicon-based film on a substrate introduced into the vacuum vessel, wherein heating means for the substrate is arranged opposite a surface of the substrate on which the silicon-based film containing the microcrystal is formed, and wherein an output of the heating means decreases as the silicon-based film containing the microcrystal is formed.

The present invention provides a method of forming a silicon-based film containing a microcrystal, comprising forming the film so that the orientation property of the microcrystal changes in a film thickness direction of the silicon-based film containing the microcrystal.

The present invention provides a method of forming a silicon-based film containing a microcrystal, comprising: introducing a source gas containing at least one of a hydrogenated silicon gas and a fluorinated silicon gas, and hydrogen into a vacuum vessel, introducing high frequency into a high frequency introducing section in the vacuum vessel, and using a high frequency plasma process to form a silicon-based film on a substrate introduced into the vacuum vessel, wherein heating means for the substrate is arranged opposite a surface of the substrate on which the silicon-based film containing the microcrystal is formed, and an output of the heating means decreases as the silicon-based film containing the microcrystal is formed.

Preferably, the semiconductor element is a photovoltaic element including at least one pin type semiconductor junction having a semiconductor layer exhibiting a first conductivity type, i-type semiconductor layers, and a semiconductor layer exhibiting a second conductivity type, the layers being mainly composed of silicon atoms and sequentially stacked on a substrate, wherein at least one of the i-type semiconductor layers includes a silicon-based film containing a microcrystal, with the orientation property of the microcrystal in the silicon-based film changing in the film thickness direction of the silicon-based film. Preferably, an amorphous silicon layer is arranged between the silicon-based film containing the microcrystal and the semiconductor layer exhibiting the first or second conductivity type which is arranged on a light incidence side relative to the silicon-based film. Preferably, an amorphous silicon layer is arranged between the silicon-based film containing the microcrystal and the semiconductor layer exhibiting the first or second conductivity type. Preferably, the amorphous silicon layer has a film thickness of 30 nm or less.

Preferably, the orientation property of the microcrystal changes so that the ratio of the diffraction intensity of a (220) face of the microcrystal as which is measured with X rays or electron rays, to the total diffraction intensity changes in the film thickness direction of the silicon-based film. Preferably, the orientation property of the microcrystal changes so that the ratio of the diffraction intensity of the (220) face of the microcrystal in the silicon-based film containing the microcrystal, which is measured with X rays or electron rays, to the total diffraction intensity is relatively low in an initial stage of film formation. Preferably, the orientation property of the microcrystal changes continuously. Preferably, the silicon-based film containing the microcrystal includes a region in which the diffraction intensity of the (220) face of the microcrystal, which is measured with X rays or electron rays, occupies 80% or more of the total diffraction intensity. Preferably, in the silicon-based film containing the microcrystal, the microcrystal which is preferentially oriented along a (110) face is shaped in a column extending in a vertical direction relative to the substrate. Preferably, a microcrystal located in an interface region of the silicon-based film containing the microcrystal is preferentially oriented along the (100) face. Preferably, the microcrystal located in the interface region is shaped in substantially a sphere. Preferably, the interface region has a film thickness of 1.0 nm or more and 20 nm or less. Preferably, the silicon-based film containing the microcrystal contains at least one kind of oxygen atoms, carbon atoms and nitrogen atoms, and the total amount of the atoms is $1.5 \times 10^{18}$ atoms/cm$^3$ or more and $5.0 \times 10^{19}$ atoms/cm$^3$ or less. Preferably, the silicon-based film containing the microcrystal contains $1.0 \times 10^{19}$ atoms/cm$^3$ or more and $2.5 \times 10^{20}$ atoms/cm$^3$ or less of fluorine atoms. Preferably, the silicon-based film containing the microcrystal is formed by a high frequency plasma CVD process of introducing a source gas containing at least one of a hydrogenated silicon gas and a fluorinated silicon gas, and hydrogen into a vacuum vessel, introducing high frequency into a high frequency introducing section in the vacuum vessel, and forming a silicon-based film on a substrate introduced into the vacuum vessel. Preferably, during the process of forming the silicon-based film containing the microcrystal, the flow rate ratio of the source gas is varied. Preferably, the source gas is introduced into the vacuum vessel using a plurality of gas introducing sections, and the source gas flowing through at least one of the plurality of gas introducing sections has a flow rate ratio different from that in the other gas introducing sections. Preferably, the high frequency is 10 MHz or more and 10 GHz or less. Preferably, the high frequency is 20 MHz or more and 300 MHz or less. Preferably, the distance between the high frequency introducing section and the substrate is 3 mm or more and 30 mm or less. Preferably, the pressure under which the silicon-based film containing the microcrystal is formed is 100 Pa (0.75 Torr) or more and 5,000 Pa (37.5 Torr) or less. Preferably, a residence time of the source gas during the formation of the silicon-based film containing the microcrystal is 0.01 second or more and 10 seconds or less. Preferably, the residence time of the source gas during the formation of the silicon-based film containing the microcrystal is 0.1 second or more and 3 seconds or less.

The present invention provides a semiconductor element comprising a semiconductor junction composed of silicon-based films, wherein at least one of the silicon-based films contains a microcrystal, and a microcrystal located in at least one interface region of the silicon-based films containing the microcrystal has no orientation property.

Further, the present invention provides a method of forming a silicon-based film containing a microcrystal, comprising forming the film so that a microcrystal located in at least one interface region of the silicon-based films containing the microcrystal has no orientation property.

Preferably, the semiconductor element is a photovoltaic element including at least one pin type semiconductor junction having a semiconductor layer exhibiting a first conductivity type, i-type semiconductor layers, and a semiconductor layer exhibiting a second conductivity type, the layers being mainly composed of silicon atoms and sequentially stacked on a substrate, wherein at least one of the i-type semiconductor layers includes a silicon-based film containing a microcrystal, a microcrystal located in at least one interface region of the silicon-based films containing the microcrystal having no orientation property. Preferably, an amorphous silicon layer is arranged between the silicon-based film containing the microcrystal and the semiconductor layer exhibiting the first or second conductivity type which is arranged on a light incidence side relative to the silicon-based film. Preferably, the amorphous silicon layer has a film thickness of 30 nm or less. Preferably, a microcrystal located in at least one of the interface regions has no orientation property, the ratio of the diffraction intensity of a (220) face of the microcrystal except for the non-orientation property region, which is measured with X rays or electron rays, to the total diffraction intensity changes in a film thickness direction of the silicon-based film. Preferably, the orientation property of the microcrystal located in the interface region is such that when measured with X rays or electron rays, three diffraction faces (111), (220), and (311) arranged in this order from the small angle side have such diffraction intensities that when the (111) face has a diffraction intensity of 1, the (220) face has a diffraction intensity of 0.50 or more and 0.60 or less, whereas the (311) face has a diffraction intensity of 0.25 or more and 0.35 or less. Preferably, the orientation property of the microcrystal changes so that the ratio of the diffraction intensity of the (220) face of the microcrystal in the silicon-based film containing the microcrystal, which is measured by X rays or electron rays, to the total diffraction intensity is relatively low in an initial stage of film formation. Preferably, the orientation property of the microcrystal changes continuously. Preferably, the silicon-based film containing the microcrystal includes a region in which the diffraction intensity of the (220) face of the microcrystal, which is measured with X rays or electron rays, occupies 80% or more of the total diffraction intensity. Preferably, in the silicon-based film containing the microcrystal, a microcrystal which is preferentially oriented along a (110) face is shaped in a column extending in a vertical direction relative to the substrate. Preferably, the microcrystal located in the interface region is shaped in substantially a sphere. Preferably, the interface region has a film thickness of 1.0 nm or more and 20 nm or less. Preferably, the silicon-based film containing the microcrystal contains at least one kind of oxygen atoms, carbon atoms and nitrogen atoms, and the total amount of the atoms is $1.5 \times 10^{18}$ atoms/cm$^3$ or more and $5.0 \times 10^{19}$ atoms/cm$^3$ or less. Preferably, the silicon-based film containing the microcrystal contains $1.0 \times 10^{19}$ atoms/cm$^3$ or more and $2.5 \times 10^{20}$ atoms/cm$^3$ or less of fluorine atoms. Preferably, the silicon-based film containing the microcrystal is formed by a high frequency plasma CVD process of introducing a source gas containing at least one of a hydrogenated silicon gas and a fluorinated silicon gas, and hydrogen into a vacuum vessel, introducing high frequency into a high frequency introducing section in the vacuum vessel, and forming a silicon-based film on a substrate introduced into the vacuum vessel. Preferably, during the process of forming the silicon-based film containing the microcrystal, the flow rate ratio of the source gas is varied. Preferably, the source gas is introduced into the vacuum vessel using a plurality of gas introducing sections, and the source gas flowing through at least one of the plurality of gas introducing sections has a flow rate ratio different from that in the other gas introducing sections. Preferably, the high frequency is 10 MHz or more and 10 GHz or less. Preferably, the high frequency is 20 MHz or more and 300 MHz or less. Preferably, the distance between the high frequency introducing section and the substrate is 3 mm or more and 30 mm or less. Preferably, the pressure under which the silicon-based film containing the microcrystal is formed is 100 Pa (0.75 Torr) or more and 5,000 Pa (37.5 Torr) or less. Preferably, a residence time of the source gas during the formation of the silicon-based film containing the microcrystal is 0.01 second or more and 10 seconds or less. Preferably, the residence time of the source gas during the formation of the silicon-based film containing the microcrystal is 0.1 second or more and 3 seconds or less. Preferably, heating means used for the substrate in forming the silicon-based film containing the microcrystal is arranged opposite a surface of the substrate on which the silicon-based film containing the microcrystal is formed, and an output of the heating means decreases as the silicon-based film containing the microcrystal is formed.

DETAILED DESCRIPTION OF THE PREFERRED EMBODIMENTS

Figure 1:
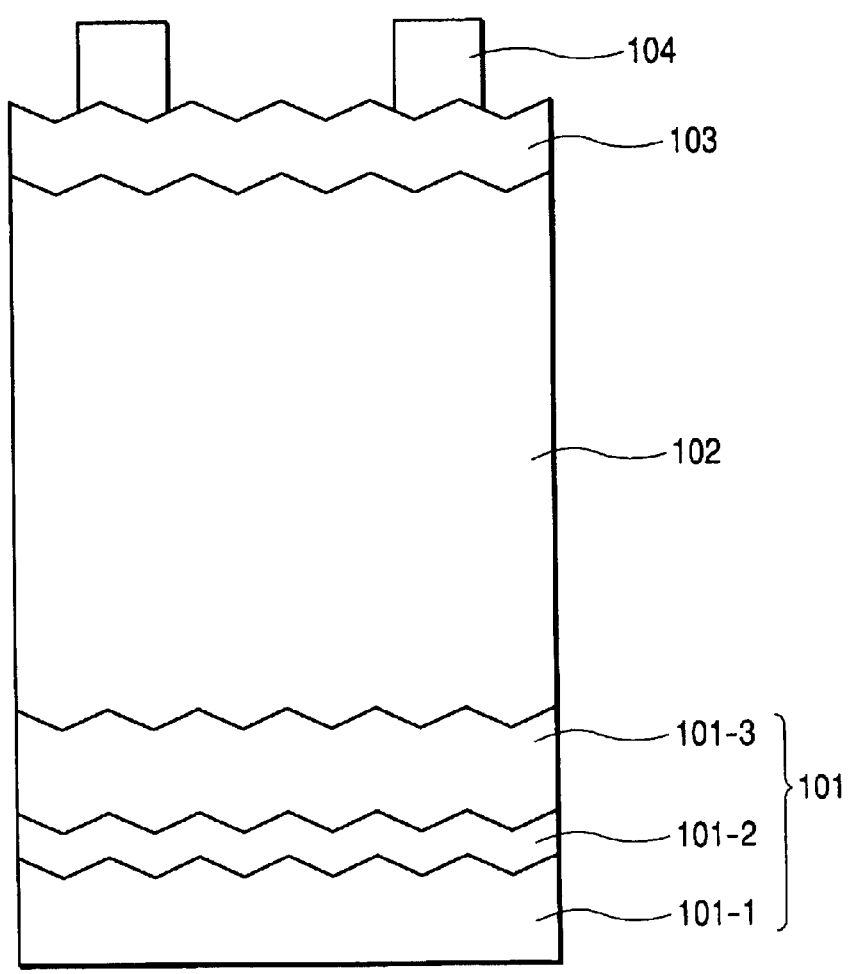
FIG. 1 is a schematic sectional view showing an example of a photovoltaic element including a semiconductor element according to the present invention.

As a result of wholehearted research for solving the problems described previously, the inventors have found that a semiconductor element having good electrical characteristics and excellent adhesion and environmental resistance can be inexpensively formed by providing a semiconductor element comprising a semiconductor junction composed of silicon-based films, at least one of the silicon-based films containing a microcrystal, the element being characterized in that (A) the orientation property of the microcrystal in the silicon-based film containing the microcrystal changes in a film thickness direction or (B) the microcrystal located in at least one of the interface regions of the silicon-based film containing the microcrystal has no orientation property.

The above configuration has the following effects:

Silicon in a crystal phase is characterized in that it has a lower Si—Si bond defect density than silicon in an amorphous phase and a larger carrier mobility and a longer rebinding lifetime than thermodynamically disequilibrium silicon in the amorphous phase. The silicon in the crystal phase is further characterized by having characteristics that are stable over time and which are unlikely to vary in a hot and humid environment or other environments. Thus, for a semiconductor element comprising a semiconductor junction composed of silicon-based films, if a silicon-based film containing a crystal phase is used in, for example, a photovoltaic element or a TFT, then it is possible to form a semiconductor element having excellent characteristics and improved safety.

On the other hand, a problem with the employment of a silicon-based film containing a crystal phase in an i-type semiconductor layer may be degraded performance associated with the adverse effects of crystal boundaries on both majority and minority carriers. To suppress the adverse effects of the crystal boundaries, it may be effective to increase the grain size of the crystal in the i-type semiconductor layer to reduce the density of the crystal boundaries.

Preferred means for increasing the crystal grain size is to suppress the occurrence of crystal nuclei to improve the orientation property of the crystal. If a film is formed in a random crystal orientation, then during growth, crystal grains may collide against each other to relatively reduce their size. However, by directing the crystal in a particular orientation and further controlling the formation of crystal nuclei to make the crystal grow in the same direction, the crystal grains can be restrained from randomly colliding against each other, thereby increasing the crystal grain size. On the other hand, if internal stress occurs in the silicon-based film, a band profile may be distorted, and when the element is irradiated with light, the magnitude of electric fields may decrease in a certain region of a carrier generation layer. Further, for TFTs, leak current may increase upon switch-off. Thus, preferably, by changing the orientation property of the silicon-based film, particularly an interface region thereof in a film thickness direction during the formation of a deposited film, the internal stress of the silicon-based film can further be reduced. The reason why the internal stress is reduced is that the orientation property can be changed in the interface region and the internal region of the silicon-based film under different mechanical stress environments, to change the directionality of Si—Si bonds.

For crystal silicon having a diamond structure, a (220) face has the highest atom density, and silicon atoms in the growing outermost face each have three of its four binding hands combined with other silicon atoms by covalent binding. Accordingly, if this is a growth face, a silicon-based film can preferably be formed in which the microcrystal has good adhesion inside it and to other microcrystals, and weatherability. Further, if an inverse staggered TFT is used as the device of an active matrix type liquid crystal apparatus and if the silicon-based film containing a microcrystal includes an activated layer having a region which contacts with an Ohmic contact layer and which is preferentially oriented along the (220) face, then when the Ohmic contact layer is dry etched, it can be completely removed without etching the activated layer or using etching stopper material such as a nitride film. This is due to the high etching-resistant property of the (220) face. According to the ASTM card, for crystal silicon without any orientation, the diffraction intensity of the (220) face nearly equals 23% of the sum of the diffraction intensities of 11 reflections starting with the small angle side, and a structure in which the ratio of the diffraction intensity of the (220) face exceeds 23% has an orientation property in this face direction. A structure including a region where the diffraction intensity of the (220) face occupies 80% or more of the total diffraction intensity is particularly preferable because the above effect is promoted.

As described above, a preferred structure is such that the orientation property of the microcrystal contained in the silicon-based film changes in the film thickness direction of the silicon-based film and that the structure includes a region where the microcrystal is preferentially oriented along the (220) face.

In a pin-type semiconductor junction photovoltaic element having a semiconductor layer exhibiting a first conductivity type, i-type semiconductor layers, and a semiconductor layer exhibiting a second conductivity type, the layers being sequentially stacked on each other, an amorphous silicon layer is preferably arranged between the silicon-based film containing the microcrystal and the semiconductor layer exhibiting the first or second conductivity type which is arranged on a light incidence side relative to the silicon-based film, thereby increasing an open-circuit voltage. At the same time, a band profile in the vicinity of the interface is improved to prevent carries from being rebound together, thus allowing more carriers to be taken out. Furthermore, dopant atoms from the conductivity type layers are prevented from diffusing into the i-type semiconductor layers. It may also be preferable to increase the concentration of hydrogen contained in the amorphous silicon layer, in the direction of the interface between this layer and the silicon-based film containing the microcrystal because this is effective in reducing stress that may occur in the vicinity of the interface. This is presumably because in a region with a high hydrogen concentration, a cluster region containing hydrogen atoms is formed to enhance the function of absorbing internal stress resulting from the inconsistency between both structures lying across the interface. In this case, if the amorphous silicon layer is excessively thick, the characteristics of the photovoltaic element are affected by degradation of the film caused by light irradiation. Accordingly, the amorphous silicon layer preferably has a film thickness of 30 nm or less.

The method of forming a silicon-based film containing a crystal phase by plasma CVD using high frequency can be carried out in a shorter process time and a lower process temperature in comparison with solid phase reaction. Accordingly, the substrate can be selected from a wider range of alternatives to allow the use of more inexpensive material such as a glass or stainless steel substrate, so that this method is advantageous in reducing costs. In particular, this effect is significant when this method is applied to the i-type semiconductor layers of a photovoltaic element having a pin junction, which layers are thick. In particular, the i-type semiconductor layers are preferably formed at a film forming rate of 2.0 nm/second or more.

In this case, if a silicon-based film with an orientation property is formed by the high frequency plasma CVD process, then the formation occurs in an atmosphere containing activated species contributing to deposition of the silicon-based film as well as activated species contributing to etching. The film deposition progresses while etching the Si—Si bonds having relatively weak binding force on the surface of the formed film, thereby forming a silicon-based film in which the microcrystal is preferentially oriented along a particular surface. In this case, the orientation property can be controlled by controlling these activated species.

If such a reaction mechanism is used to form a film, the crystal having the (220) orientation property desirably has a low nucleus density in an initial stage of film formation. If the crystal having the (220) orientation property has a high nucleus density, a silicon-based film may be formed using these crystal nuclei as starting points, thus relatively reducing the size of crystal grains in the entire silicon-based film. Further, if a film is formed in an atmosphere in which the degree of the orientation of the interface region increases, i.e. an atmosphere contributing to etching, then an underlying layer may be damaged. Thus, in the initial stage of the formation of a silicon-based film containing a microcrystal, the orientation along the (220) face is preferably kept relatively insignificant while ensuring high crystallinity.

If a crystalline silicon-based film is formed, then an amorphous incubation layer with silicon atoms arranged in disorder may disadvantageously be formed in the interface region, corresponding to the initial stage of film formation. This phenomenon occurs presumably because in the interface region, corresponding to the initial stage of film formation, a starting point for film growth has not been clarified yet with the three-dimensional structure of the atomic arrangement insufficiently established, so that if the atomic arrangement is disturbed during film formation, a film is formed while retaining the disturbed structure therein. In this case, to prevent the above-mentioned amorphous incubation layer from being formed, it is important to preclude the atomic arrangement from being disturbed during the formation of the interface region. If no hydrogen adheres to the growth face of the silicon with dangling bonds exposed therefrom, then the symmetry of the atomic arrangement is impaired because of a Jahn-Teller effect, thereby disturbing the atomic arrangement to induce the formation of an amorphous phase. In contrast, if the hydrogen amount present on the growth face exceeds an amount required to terminate the dangling bonds, then the Si—Si bonds or Si—H bonds may be cut to reduce the stability of the structure. These phenomena are particularly outstanding during high-speed film formation.

Thus, the interface region of the silicon-based film is preferably formed by supplying an appropriate amount of hydrogen to the growth face in an atmosphere having a low etching effect. With an appropriate amount of hydrogen supplied to the growth face, bonds in the vicinity of the surface are hardened to reduce the mobility of surface atoms, thereby hindering very small regions formed as buds of crystal nuclei from joining with adjacent very small regions having different orientation properties. Since the buds of the crystal nuclei are not selectively formed in any particular orientation, the resulting interface region preferably has no orientation property, i.e. is not oriented along any particular face. Particularly preferably, in a TFT, a perfect crystal can be formed in a region contacting with a gate insulating film, thereby forming a region with high conductivity. To produce the above effect, the interface region preferably has a film thickness of 1.0 nm or more and 20 nm or less.

As a result of wholehearted examinations, it has been found that the orientation property of the interface region is such that when measured with X rays, three diffraction faces (111), (220), and (311) arranged in this order from the small angle side have such diffraction intensities that when the (111) face has a diffraction intensity of 1, the (220) face has a diffraction intensity of 0.50 or more and 0.60 or less, whereas the (311) face has a diffraction intensity of 0.25 or more and 0.35 or less.

Further, in an atmosphere with a relatively small etching effect, the (100) face may grow faster than the (220) face, so that it is possible to reduce the density of crystal nuclei oriented along the (220) face while maintaining excellent crytallinity. Consequently, it is also preferable that the microcrystal in the interface region of the silicon-based film containing the microcrystal is preferentially oriented along the (100) face. In this case, particularly preferably, in a TFT, the region contacting with the gate insulating film can have high conductivity and a very smooth surface. To produce the above effect, the interface region preferably has a film thickness of 1.0 nm or more and 20 nm or less.

Further, to reduce the adhesion and internal stress of the interface, the microcrystal located in the interface region preferably has a substantially spherical outward form having no particular orientation.

The microcrystal in the silicon-based film which is located in a region contiguous to the interface region is preferably more markedly oriented along the (220) face than the interface region using crystal nuclei oriented along the (220) face of the interface region, as seed crystals. In the photovoltaic element, the microcrystal more preferably has a columnar structure in the direction in which carriers move, thus improving the mobility of the carriers.

Further, when the silicon-based film containing the microcrystal contains at least one kind of oxygen atoms, carbon atoms and nitrogen atoms, the atoms are preferably arranged in void-like spaces at crystal boundaries to improve structural stability. Furthermore, by increasing the resistance of the crystal boundaries, leak current can be suppressed. Moreover, although the reason cannot be explained in detail, the silicon-based film containing the above atoms is preferable because the sectional size of the microcrystal is improved in its uniformity to hinder new crystal nuclei from occurring on the growth face. These effects are more pronounced when the total amount of oxygen, carbon, and nitrogen atoms is $1.5 \times 10^{18}$ atoms/cm$^3$ or more. If the total amount of oxygen, carbon, and nitrogen atoms is excessively large, the atoms are incorporated in the bulk of the microcrystal to reduce the crystallinity. The total amount of oxygen, carbon, and nitrogen atoms is preferably $5.0 \times 10^{19}$ atoms/cm$^3$ or less.

Further, preferably, when the silicon-based film containing the microcrystal contains fluorine atoms, the microcrystal boundaries are efficiently passivated, and the fluorine atoms, having high electronegativity, serve to inactivate dangling bonds of silicon atoms clearly existing at the microcrystal boundaries. The amount of fluorine atoms is preferably $1.0 \times 10^{19}$ atoms/cm$^3$ or more and $2.5 \times 10^{20}$ atoms/cm$^3$ or less.

With a method of introducing a source gas into a vacuum vessel and using the high frequency plasma CVD to form a silicon-based film on a substrate introduced into the vacuum vessel, plasma density per discharge space volume increases with decreasing a distance between a high frequency introducing section and the substrate. Accordingly, reaction species contributing to the formation of a deposited film can be more densely formed, thereby increasing the film forming rate.

On the other hand, the density of electrons in plasma and thus the amount of ions generated increase with decreasing a distance between the high frequency introducing section and the substrate. Since ions are accelerated by electrostatic attraction in a sheath region in the discharge space, the resultant ion collision may distort the arrangement of atoms in the bulk or form voids in the film, hindering the formation of a high-quality silicon-based film or degrading adhesion to an underlying layer or environment resistance. In this case, it is expected that by increasing a pressure in the film forming space, the ions in the plasma are more prone to collide against other ions or activated species to reduce their impact force or amount, thereby relatively weakening ion impact.

With a high frequency plasma CVD process of using a source gas containing hydrogenated silicon, fluorinated silicon and hydrogen, activated species such as $SiF_nH_m$ ($0 \leq n$, $m \leq 4$), HF, F, H are generated. A plasma atmosphere containing these activated species is characterized in that some of these species contribute to deposition of a silicon-based film, while others contribute to etching. Thus, the film deposition progresses while etching the Si—Si bonds having relatively weak binding force in the film surface, thereby making it possible to form a silicon-based film having higher crystallinity and a smaller amorphous region. Further, during etching, as the bonds are cut, radicals are formed to facilitate structure relaxation, thereby making it possible to form a good silicon-based film at lower process temperature.

With a high frequency plasma CVD process using a source gas containing fluorinated silicon and hydrogen, fluorinated silane-based activated species containing hydrogen such as $SiF_2H$ and $SiFH_2$ which are formed by adding hydrogen to fluorinated silicon are formed to enable high-speed film formation. To form fluorinated silane-based activated species containing hydrogen such as $SiF_2H$ and $SiFH_2$, it is important to efficiently decompose fluorinated silicon into SiF and to achieve an active reaction process using the formed SiF and activated hydrogen. In particular, it is important that a sufficient amount of SiF is present in the plasma.

The control of the plasma process is an important technical problem in forming a silicon-based film having the above-described orientation property and crystallinity, totally at a high film forming rate by depositing it while carrying out etching. In this case, it is important to increase the plasma density per discharge space volume as described previously in order to achieve an active reaction process using SiF and activated hydrogen. However, to form a larger amount of activated hydrogen in an atmosphere with the density of electrons in the plasma increased, introduction of the source gas must be controlled so as to suppress exhaustion of hydrogen molecules. Furthermore, if the density of radicals such as SiH and $SiH_2$ increases in the plasma, crystallization is prone to occur in the discharge space and on the surface of the deposited film using these radicals as nuclei. This may cause reaction by-products such as polysilane to be formed or inhibit an increase in crystal grain size, so that the density of radicals such as SiH and $SiH_2$ must be controlled. To achieve this, it is effective, while promoting the decomposition of the source gas, to supply a larger amount of a new source gas to activate secondary reaction that facilitates elimination of radicals such as SiH and $SiH_2$ with the source gas decomposition progressing.

In this connection, as plasma parameters, the volume of the discharge space, in which plasma is being generated, is defined as V (m$^3$), the flow rate of the source gas is defined as Q (cm$^3$/min (normal)), and the pressure in the discharge space is defined as P (Pa). Then, by using a residence time $\tau$(second), defined by $\tau = 592 \times V \times P/Q$, and the luminous intensity of the plasma as plasma control parameters, plasma having a desired plasma atmosphere can be generated. To obtain a high-quality silicon-based film, it is important to control the residence time in addition to the above-described parameters such as the distance between the high frequency introducing section and the substrate, and the pressure.

As a result of wholehearted examinations based on the above description, the inventors have found that a silicon-based film having a reduced defect density and excellent characteristics can be formed at a higher speed in a region in which the residence time $\tau$, defined by $\tau=592 \times V \times P/Q$, is 0.01 second or more and 10 seconds or less when the distance between the high frequency introducing section and the substrate is 3 mm or more and 30 mm or less, the pressure in the discharge space is 90 Pa (0.68 Torr) or more and $1.5 \times 10^4$ Pa (113 Torr) or less, the volume of the discharge space, in which plasma is being generated, is defined as V ($m^3$), the flow rate of the source gas is defined as Q ($cm^3$/min (normal)), and the pressure in the discharge space is defined as P(Pa). Thus, the density of radicals such as SiH and $SiH_2$ can be controlled to form the desired silicon-based film. In this case, the CVD process preferably uses a high frequency between 10 MHz and 10 GHz. Furthermore, the CVD process particularly preferably uses a high frequency between 20 MHz and 300 MHz so as to appropriately control the temperature of electrons in the plasma and to form plasma uniformly extending over a large area.

Further, in forming a device such as a photovoltaic element, the above ranges serve to suppress degradation of the components, film quality, and characteristics of the underlying layer due to reduction effected by hydrogen in the plasma atmosphere, thereby avoiding the adverse effects on the underlying layer. Using an underlying layer comprising a transparent conductive film composed of a metal oxide such as a zinc oxide particularly effectively prevents a decrease in the transmittance of the transparent conductive film caused by the reduction and the associated degradation of the characteristics of the photovoltaic element.

Another effect is improvement of the adhesion between the silicon-based film and the underlying layer. This effect is obtained presumably because the active surface diffusion of $SiF_2H$ and $SiFH_2$ radicals causes a deposited film to be formed while always reducing stress and strain in the vicinity of the surface. This effect is particularly effective in a configuration in which the orientation property in the silicon-based film changes in the film thickness direction. Further, the partial pressure of the hydrogen relatively increases to enhance the passivation effect on the crystal boundaries to further inactivate the crystal boundaries, thereby suppressing rapid separation of hydrogen atoms incorporated in a silicon network. This prevents a plastic flow resulting from the occurrence of irregular regions in the silicon network and associated cracks or aggregation to enable the formation of a silicon-based film having high film quality and excellent adhesion. Configuration with this silicon-based film provides a photovoltaic element having improved environment resistance.

In view of the adverse effects on the underlying layer and decreases in adhesion, environment resistance, and photo-degradation rate, it is preferable that the pressure is 100 Pa (0.75 Torr) or more and 5,000 Pa (37.5 Torr) or less, and the residence time is 0.1 second or more and 3 seconds or less.

By varying the flow rate ratio of gases in the source gas during the formation of a silicon-based film, the ratio of activated species contributing to deposition in the plasma to activated species contributing to etching can be controlled, thereby controlling the orientation property of the microcrystal in the silicon-based film. To form a plasma atmosphere with a high orientation property, conditions can be set such that for a system of fluorinated silicon gas and hydrogen, the partial pressure of the fluorinated silicon gas in the source gas can be increased, or for a system of hydrogenated silicon gas and hydrogen, the partial pressure of the hydrogen in the source gas can be increased, or for a mixed system of fluorinated silicon gas and hydrogenated silicon gas, the partial pressure of the fluorinated silicon gas in the source gas can be increased. The plasma atmosphere can be varied during film deposition by varying the flow rate ratio of the introduced source gas or arranging the activated species within the plasma so as to obtain a particular distribution of the species density in the case of a film forming method such as a roll-to-roll process in which the substrate is moved in the plasma space. A preferred method is to introduce the source gas into a single plasma space through a plurality of gas introducing sections so that the source gas flowing through at least one of the gas introducing sections has a flow rate ratio different from that in the other gas introducing sections.

To form a silicon-based film containing a crystal phase using the high frequency plasma CVD process, the temperature of the formation surface of the deposited film must be appropriately controlled in order to preferably facilitate reaction processes such as adsorption, separation, removal, injection, and surface diffusion. To achieve this, heating means such as a resistance heater or a lamp heater must be used to directly or indirectly heat the surface of the substrate before forming a silicon-based film containing a crystal phase. On the other hand, induction of plasma increases the temperature of the substrate surface owing to the impact of activated species from the plasma. This is particularly significant if the distance between the high frequency introducing section and the substrate is reduced or high frequency power is raised so as to increase the plasma density per discharge space volume. If the temperature of the surface of the substrate on which a film is formed becomes excessively high, the reaction processes occurring on the surface are unbalanced, thereby causing crystal nuclei to be formed to increase the density of the crystal boundaries, hindering the film from being appropriately crystallized, or making the inactivation of grain boundaries caused by passivation insufficient. Further, the control of the activated species contributing to film formation is disturbed, thus disordering the control of the orientation property of the crystal phase.

If the temperature of the substrate is controlled using heating means arranged opposite a surface of the substrate on which a silicon-based film containing a microcrystal is formed, then an output of the heating means is preferably reduced while a silicon-based film containing the microcrystal is sequentially formed because the film formed surface is inhibited from being excessively heated. In this connection, for a film forming method such as a roll-to-roll process in which the substrate is moved in the plasma space, outputs of a plurality of heating means arranged in the direction in which the substrate is transported are preferably varied while a deposited film is sequentially formed. Specifically, a preferred method comprises setting the largest value for the output of the heater located at a position corresponding to the point immediately before the start of film formation and gradually reducing values for the outputs of the heaters following the above heater in the downstream direction of transportation, or zeroing the outputs of at least some of the heaters during film formation.

Now, taking a photovoltaic element as an example of the semiconductor element of the present invention, its components will be described.

FIG. 1 is a schematic sectional view showing an example of the photovoltaic element of the present invention. In the figure, reference numeral 101 denotes a substrate, 102 is a semiconductor layer, 103 is a second transparent conductive layer, and 104 is a collecting electrode. Further, reference numeral 101-1 denotes a base member, 101-2 is a metal layer, and 101-3 is a first transparent conductive layer. These members 101-1, 101-2 and 101-3 are the constituent members of the substrate 101.

(Base Member)

Preferably, the base member 101-1 is a plate-like member or a sheet-like member composed of metal, resin, glass, ceramics, or a semiconductor bulk. The surface of the base member may be provided with fine projections and recesses. The base member may be transparent so that light is incident from the base member side. Alternatively, the base member may be elongated so as to allow a film to be continuously formed using the roll to roll process. In particular, flexible material such as stainless steel or polyimide is suitable as material for the base member 101-1.

(Metal Layer)

The metal layer 101-2 acts as both an electrode and a reflection layer that reflects light reaching the base member 101-1 for reuse in the semiconductor layer 102. A suitable material for the metal layer is Al, Cu, Ag, Au, CuMg, or AlSi. A suitable method of forming the metal layer 101-2 is deposition, sputtering, electrodeposition, or printing. The metal layer 101-2 preferably has an uneven surface. This increases the optical path length of reflected light in the semiconductor layer 102 to increase short circuit current. If the base member 101-1 is conductive, the metal layer 101-2 may not be formed.

(First Transparent Conductive Layer)

The first transparent conductive layer 101-3 serves to boost irregular reflection of incident or reflected light to increase the optical path length in the semiconductor layer 102. Further, the first transparent conductive layer 101-3 serves to prevent elements of the metal layer 101-2 from diffusing or migrating into the semiconductor layer 102 to shunt the photovoltaic element. Furthermore, when provided with appropriate resistance, the layer 101-3 serves to prevent a short circuit caused by defects such as pinholes in the semiconductor layer. Furthermore, the first transparent conductive layer 101-3 desirably has an uneven surface similarly to the metal layer 101-2. The first transparent conductive layer 101-3 is preferably composed of a conductive oxide such as ZnO or ITO and is preferably formed using a process such as deposition, sputtering, CVD, or electrodeposition. Substance that changes conductivity may be added to these conductive oxides.

Then, an example will be described in which zinc oxide (ZnO) is used as the conductive oxide.

A preferred method of forming a zinc oxide layer is sputtering, electrodeposition, or a combination thereof.

If a zinc oxide film is formed by sputtering, influential conditions include the method used, the type and flow rate of gas, internal pressure, introduced power, film forming rate, and substrate temperature. If for example, a zinc oxide film is formed using a zinc oxide target by DC magnetron sputtering, the type of the gas used includes Ar, Ne, Kr, Xe, Hg, or $O_2$, and the flow rate, which depends on the size of the apparatus and exhaust velocity, is desirably between 1 and 100 sccm if for example, the film formation space has a volume of 20 liters. Further, internal pressure during film formation is desirably between $1\times10^{-4}$ and 0.1 Torr. The introduced power, which depends on the size of a target, is desirably between 10 W and 100 KW if the target has a diameter of 15 cm. Further, substrate temperature, the suitable range of which depends on the film forming rate, is desirably between 70° C. and 450° C. if the film forming rate is 1 μm/h.

To form a zinc oxide film using an electrodeposition process, a water solution containing nitrate and zinc ions is preferably used in a corrosion-resistant vessel. The nitrate and zinc ions desirably have a concentration between 0.001 and 1.0 mol/liter, more desirably between 0.01 and 0.5 mol/liter, and much more desirably between 0.1 and 0.25 mol/liter. A source of nitrate and zinc ions is not particularly limited but may be nitrate zinc, which supplies both ions, or a mixture of water-soluble nitrate such as ammonium nitrate, which supplies nitrate ions, and zinc nitrate, which supplies zinc ions. Furthermore, carbohydrate is preferably added to this water solution in order to suppress abnormal growth and improve the adhesion. The type of carbohydrate is not particularly limited but may be monosaccharide such as glucose (grape sugar) or fructose (fruit sugar), disaccharide such as maltose (malt sugar) or saccharose (cane sugar), polysaccharide such as dextrine or starch, or a mixture thereof. The amount of carbohydrate in the water solution, which depends on its type, is desirably between 0.001 and 300 g/liter, more desirably between 0.005 and 100 g/liter, and much more desirably between 0.01 and 60 g/liter. If a zinc oxide film is deposited using the electrodeposition process, then in the water solution described previously, the base member on which a zinc oxide film is deposited is used as a negative electrode, whereas zinc, platinum, or carbon is used as a positive electrode. In this case, current flowing through a load resistor has a density between 10 mA/dm and 10 A/dm.

(Substrate)

Using the above method, the metal layer 101-2 and the first transparent conductive layer 101-3 are stacked on the base member 101-1 as required to form a substrate 101. Further, to facilitate integration of elements, an insulating layer may be provided in the substrate 101 as an intermediate layer.

(Semiconductor Layer)

The semiconductor layer 102, a part of which is constituted by the silicon-based film of the present invention, is mainly composed of Si. In addition to Si, an alloy of Si and C or Ge may be used. For a p-type, the semiconductor layer contains III group elements, and for an n-type, it contains V group elements. As an electrical characteristic of the p- and n-type layers, activation energy is preferably 0.2 eV or less and optimally 0.1 eV or less. Further, resistivity is preferably 100 Ωcm or less and optimally 1 Ωcm or less. For a stack cell (a photovoltaic element having a plurality of pin junctions), preferably the i-type semiconductor layer of the pin junction closest to the light incidence side has a wider band gap, and the band gap narrows as the distance from the light incidence side increases. A light incidence-side dope layer (p- or n-type) is suitably a crystalline semiconductor with small light absorption or a semiconductor with a wide band gap.

Figure 3:
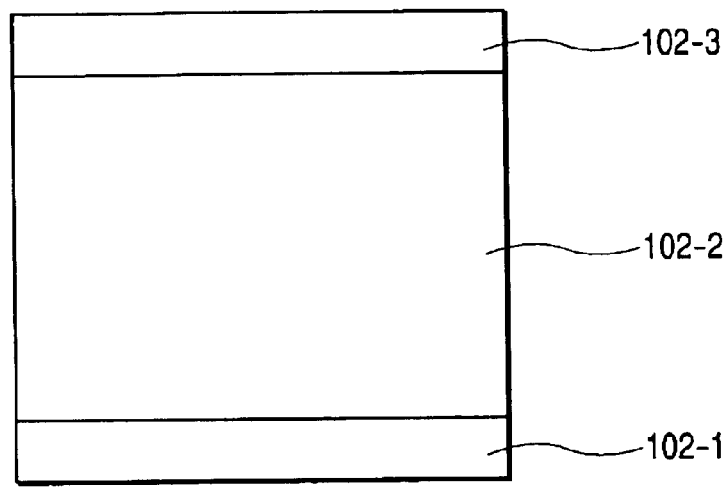
FIG. 3 is a schematic sectional view showing an example of a semiconductor layer including the semiconductor element of the present invention.

The semiconductor layer 102 as a component of the present invention will be further described. FIG. 3 is a schematic sectional view showing the semiconductor layer 102 having one pin junction as an example of the photovoltaic element of the present invention. In this figure, reference numeral 102-1 denotes a semiconductor layer having a first conductivity type, and on the semiconductor layer 102-1 are stacked an i-type semiconductor layer 102-2 composed of the silicon-based film of the present invention and a semiconductor layer 102-3 exhibiting a second conductivity type. In the semiconductor layer having a plurality of pin junctions, at least one of the pin junctions preferably has the above-described structure.

Further, a stack cell with two pin junctions stacked on each other has a combination of i-type silicon-based semiconductor layers including, for example, an amorphous silicon semiconductor layer and a silicon semiconductor layer containing a microcrystal or a silicon semiconductor layer containing a microcrystal and a silicon semiconductor layer containing a microcrystal arranged in this order from the light incidence side.

Furthermore, a stack cell with three pin junctions stacked on each other has a combination of i-type silicon-based semiconductor layers including, for example, an amorphous silicon semiconductor layer, a silicon semiconductor layer containing a microcrystal, and a silicon semiconductor layer containing a microcrystal or an amorphous silicon semiconductor layer, a silicon semiconductor layer containing a microcrystal, and an amorphous silicon germanium semiconductor layer arranged in this order from the light incidence side. The i-type semiconductor layer preferably has an adsorption coefficient ($\alpha$) of 5,000 cm$^{-1}$ or more of light (630 nm), has a light conductivity ($\sigma p$) of $10 \times 10^{-5}$ S/cm or more when irradiated with solar simulator light using the solar simulator (AM 1.5, 100 mW/cm$^2$), and has a dark conductivity ($\sigma d$) of $10 \times 10^{-6}$ S/cm or less and an Urbach energy of 55 meV or less based on a constant photocurrent method (CPM). The i-type semiconductor layer may only slightly exhibit p- or n-type characteristics. Alternatively, if the i-type semiconductor layer is a silicon germanium semiconductor layer, an i-type semiconductor layer containing no germanium may be inserted into either a p/i or n/i interface in order to lower an interface level and increase open-circuit voltage.

(Method of Forming Semiconductor Layer)

The high frequency plasma CVD process is suitable for forming the silicon-based film and semiconductor layer 102 of the present invention. A preferred example of a procedure of forming the semiconductor layer 102 using the high frequency plasma CVD process will be shown below.

The internal pressure of a semiconductor formation vacuum vessel capable of making its inside in a reduced-pressure state is reduced to a deposition pressure.

Material gases containing a source gas, a diluting gas and the like are introduced into a deposition chamber, which is then exhausted using a vacuum pump so as to set the pressure in the deposition chamber at a predetermined value.

The substrate 101 is set at a predetermined temperature using a heater.

A high frequency oscillated using a high frequency power supply is introduced into the deposition chamber. If the high frequency is a microwave, it is guided into the deposition chamber through a waveguide and via a dielectric window composed of quartz, alumina or aluminum nitride. If the high frequency is VHF or RF, it is guided into the deposition chamber through a coaxial cable and via a metal electrode.

Plasma is induced in the deposition chamber to decompose the source gas to form a deposited film on the substrate 101 arranged in the deposition chamber. This procedure is repeated a plurality of times as required to form the semiconductor layer 102.

As preferred conditions for forming the semiconductor layer 102, the temperature of the substrate in the deposition chamber is from 100 to 450° C., the pressure in the deposition chamber is from 0.067 Pa (0.5 mTorr) to $1.5 \times 10^4$ Pa (113 Torr), and high frequency power density is between 0.001 and 2 W/cm$^3$. Furthermore, to form the silicon-based film of the present invention, the residence time $\tau$, defined by $\tau = 592 \times V \times P/Q$, must be 0.01 second or more and 10 seconds or less when the distance between the high frequency introducing section and the substrate is 3 mm or more and 30 mm or less, the pressure is 100 Pa (0.75 Torr) or more and 5,000 Pa (37.5 Torr) or less, the volume of the discharge space, in which plasma is being generated, is defined as V (m$^3$), the flow rate of the source gas is defined as Q (cm$^3$/min (normal)), and the pressure in the discharge space is defined as P(Pa). Further, the high frequency power density is preferably from 0.05 to 2 W/cm$^3$.

A source gas suitable for forming the silicon-based film and semiconductor layer 102 of the present invention includes fluorinated silicon such as $SiF_4$, $SiH_2F_2$, $SiH_3F$, or $Si_2F_6$, or a hydrogenated silicon compound such as $SiH_4$ or $Si_2H_6$. To obtain an alloy-based film or layer, a compound such as $GeH_4$ or $CH_4$ which contains Ge or C and which can be gasified is preferably further introduced into the deposition chamber after being diluted with hydrogen gas. Inactivated gas such as He may further be added. Further, a compound which contains nitrogen and oxygen and which can be gasified is may be added as source gas or diluting gas. A dopant gas for obtaining a p-type semiconductor layer may be $B_2H_6$, $BF_3$, or the like. A dopant gas for obtaining an n-type semiconductor layer may be $PH_3$, $PF_3$, or the like. To deposit a thin film of a crystal phase or a layer made of SiC or the like and which has insignificant light absorption or a large band gap, it is preferable to increase the ratio of the diluting gas to the source gas and introduce high frequency with a relatively high power density.

(Second Transparent Conductive Layer)

The second transparent conductive layer 103 serves as a light incidence-side electrode and can also serve as a reflection preventing film if it has an appropriately set film thickness. The second transparent conductive layer 103 needs to have a high transmittance in a wavelength region that can be absorbed by the semiconductor layer 102 and to have a low resistivity. The transmittance at 550 nm is preferably 80% or more and more preferably 85% or more. The resistivity is preferably $5 \times 10^{-3}$ $\Omega$cm or less and more preferably $1 \times 10^{-3}$ $\Omega$cm or less. Preferred material for the second transparent conductive layer 103 is ITO, ZnO, $In_2O_3$, or the like. A preferred method of forming the second transparent conductive layer 103 is evaporation, CVD, spraying, spin-on, dipping, or the like. Substance that changes conductivity may be added to these materials.

(Collecting Electrode)

The collecting electrode 104 is provided on the transparent electrode 103 to improve collecting efficiency. A preferred method of forming the collecting electrode 104 is to form metal electrode pattern by sputtering using a mask, or to print conductive paste or solder paste, or to secure a metal wire with conductive paste.

Protective layers may be formed on both sides of the photovoltaic element as required. At the same time, a reinforcing material such as a steel plate may be provided on the back surface (at a side opposite to the light incidence side) of the photovoltaic element.

In the following examples, the present invention will be specifically described taking a solar cell and a TFT as examples of semiconductor elements. However, these examples do not limit the contents of the present invention.

EXAMPLE 1

Figure 2:
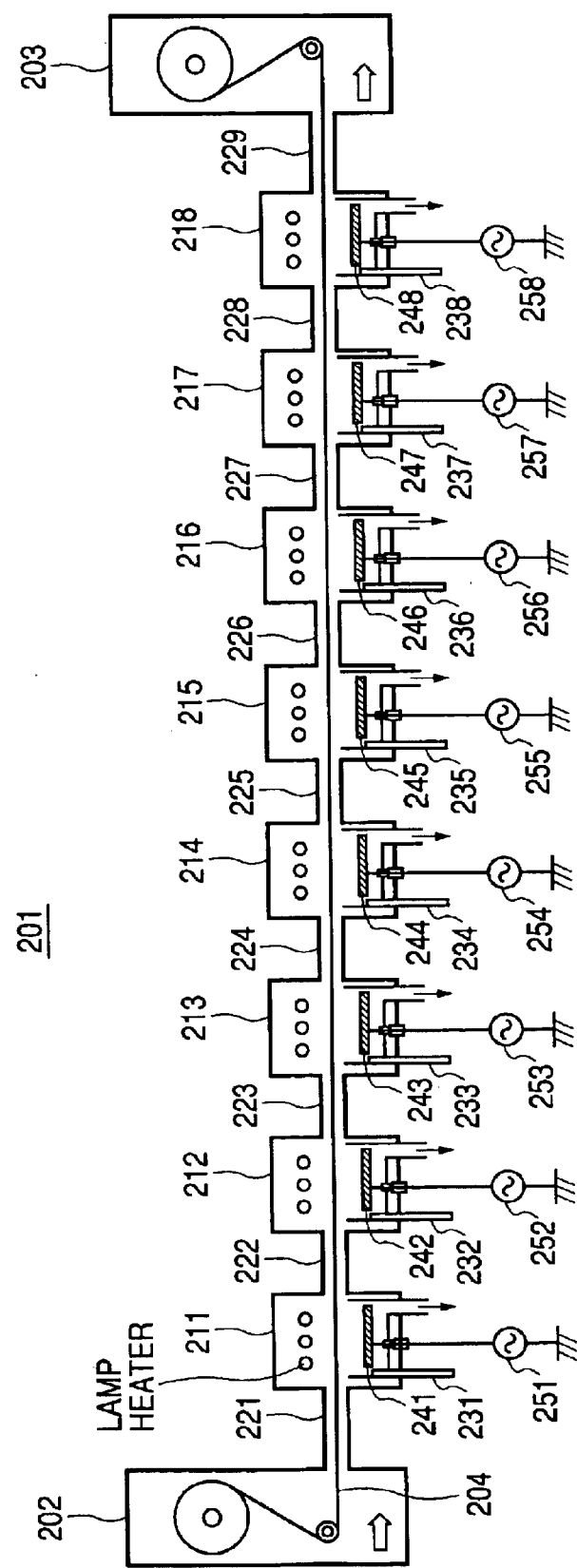
FIG. 2 is a schematic sectional view showing an example of a deposited film forming apparatus for manufacturing the semiconductor element and photovoltaic element of the present invention.
Figure 4:
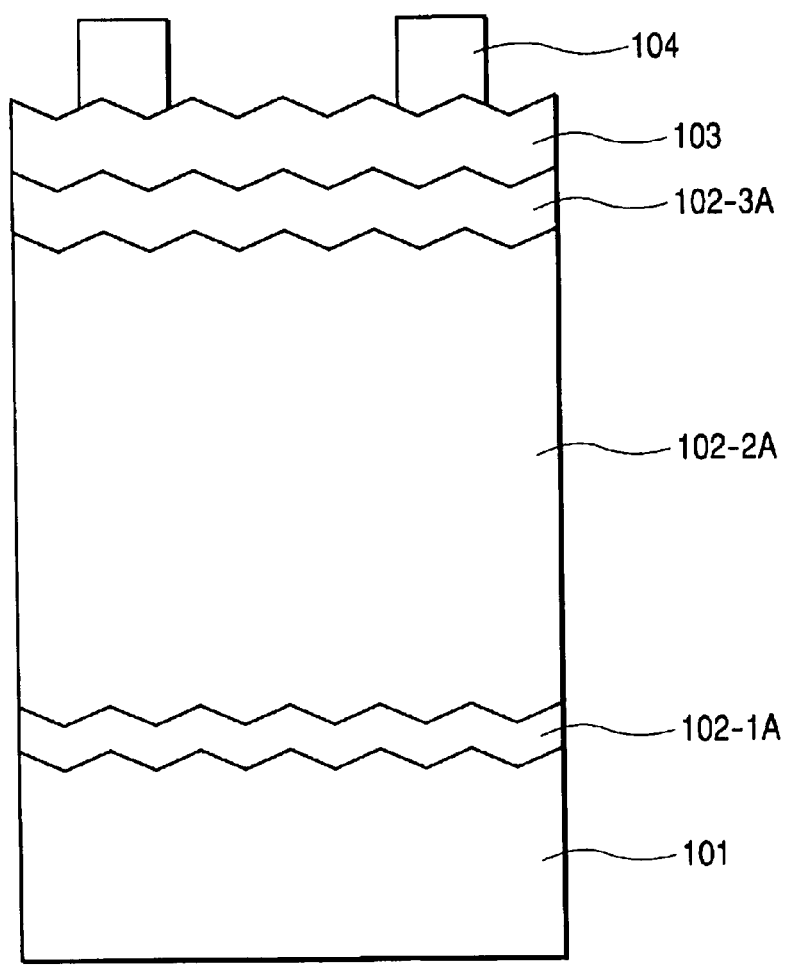
FIG. 4 is a schematic sectional view showing an example of a photovoltaic element including the semiconductor element of the present invention.

A deposited film forming apparatus 201, shown in FIG. 2, was used to form the photovoltaic element shown in FIG. 4, using the following procedure: FIG. 4 is a schematic sectional view showing an example of a photovoltaic element having the silicon-based film of the present invention. In this figure, members that are similar to those in FIG. 1 are denoted by the same reference numerals, and their description is omitted. The semiconductor layer of this photovoltaic element is composed of an amorphous n-type semiconductor layer 102-1A, a microcrystalline i-type semiconductor layer 102-2A, and a microcrystalline p-type semiconductor layer 102-3A. That is, this photovoltaic element is composed of a so-called pin type single cell.

FIG. 2 is a schematic sectional view showing an example of the deposited film forming apparatus that manufactures the silicon-based film and photovoltaic element of the present invention. The deposited film forming apparatus 201, shown in FIG. 2, is composed of a substrate feeding vessel 202, semiconductor formation vacuum vessels 211 to 218, and a substrate wind-up vessel 203 which are all joined together via gas gates 221 to 229. The deposited film forming apparatus 201 has a belt-like conductive substrate 204 set therein so as to penetrate the vessels and gas gates. The belt-like conductive substrate 204 is wound off from a bobbin installed in the substrate feeding vessel 202 and then wound up around another bobbin in the substrate wind-up vessel 203.

The semiconductor formation vacuum vessels 211 to 218 each have a deposition chamber in which a plasma induced region is formed. The deposition chamber is constructed so that a discharge space with plasma induced therein is vertically defined by the conductive substrate and high frequency introducing sections and transversely defined by a discharge plate installed so as to enclose the high frequency introducing section.

In the plate-like high frequency introducing sections 241 to 248 in the respective deposition chambers, high frequency power supplies 251 to 258 apply high frequency power to induce glow discharge, thereby decomposing source gas to deposit a semiconductor layer on the conductive substrate 204. The high frequency introducing sections 241 to 248 are opposite the conductive substrate 204 and each comprise a height adjusting mechanism (not shown in the drawings). The height adjusting mechanisms enable the distance between the conductive substrate and the high frequency introducing sections to be varied, while simultaneously enabling the volume of the discharge space to be varied. Further, the semiconductor formation vacuum vessels 211 to 218 have gas introducing pipes 231 to 238, respectively, connected thereto to introduce a source gas and a diluting gas.

The deposited film forming apparatus 201, shown in FIG. 2, comprises eight semiconductor formation vacuum vessels, but in the following examples, glow discharge need not be induced in all the semiconductor formation vacuum vessels. Whether or not glow discharge is induced in a particular vessel can be selected in accordance with the layer configuration of a photovoltaic element to be manufactured. Further, each semiconductor formation vacuum vessel is provided with a film forming region adjusting plate, not shown in the drawings, for adjusting the contact area between the conductive substrate 204 and discharge space in the deposition chamber.

First, before forming a photovoltaic element, the silicon-based film was experimented and checked for an orientation property. A belt-like base member (50 cm in width, 200 m in length, and 0.125 mm in thickness) composed of stainless steel (SUS430BA) was sufficiently degreased and washed, and then installed in a continuous sputtering apparatus, not shown in the drawings. Then, an Ag electrode was used as a target to deposit a thin Ag film of 100 nm thick on the base member by sputtering. Furthermore, a ZnO target was used to deposit a thin ZnO film of 1.2 $\mu$m thick on the thin Ag film by sputtering to form the belt-like conductive substrate 204.

Then, a bobbin around which the conductive substrate 204 has been wound was installed in the substrate feeding vessel 202, and the conductive substrate 204 was passed through the loading gas gate, the semiconductor formation vacuum vessels 211, 212, 213, 214, 215, 216, 217, and 218, and the unloading gas gate to the substrate wind-up vessel 203, and tension was then adjusted so as not to slacken the belt-like conductive substrate 204. Then, the substrate feeding vessel 202, the semiconductor formation vacuum vessels 211, 212, 213, 214, 215, 216, 217, and 218, and the substrate wind-up vessel 203 were sufficiently evacuated down to $6.7 \times 10^{-4}$ Pa ($5 \times 10^{-6}$ Torr) or less using an evacuation system composed of a vacuum pump, not shown in the drawings.

Then, a source gas and a diluting gas were supplied to the semiconductor formation vacuum vessel 212 through a gas introducing pipe 232 while operating the evacuation system. The deposition chamber in the semiconductor formation vacuum vessel 212 had a longitudinal length of 1 m and a transverse width of 50 cm. The semiconductor formation vacuum vessels other than the one 212 were supplied with 200-cm$^3$/min (normal) H$_2$ gas through gas introducing pipes, while simultaneously each gas gate was supplied with 500-cm$^3$/min (normal) H$_2$ gas through gate gas supply pipes (not shown in the drawings) as gate gas. Under these conditions, the exhaust performance of the evacuation system was adjusted to regulate the pressure in the semiconductor formation vacuum vessel 212 to a predetermined value. Formation conditions are shown in the formation conditions for 212 in Table 1.

Once the pressure in the semiconductor formation vacuum vessel 212 was stabilized, the conductive substrate 204 started to be moved from the substrate feeding vessel 202 toward the substrate wind-up vessel 203.

Then, high frequency from a high frequency power supply 252 was introduced into the high frequency introducing section 242 in the semiconductor formation vacuum vessel 212, and the height adjusting mechanism was used to set the distance between the conductive substrate and the high frequency introducing section at 9 mm. Glow discharge was induced in the deposition chamber in the semiconductor formation vacuum vessel 212 to form a 1-$\mu$m silicon-based film on the conductive substrate 204. At this time, high frequency of 60 MHz was introduced into the semiconductor formation vacuum vessel 212 through the high frequency introducing section 242, composed of a metal electrode made of Al, while adjusting the power density to 400 mW/cm$^3$ (Comparative Example 1-1).

Then, high frequency from a high frequency power supply 253 was introduced into the high frequency introducing section 243 in semiconductor formation vacuum vessel 213, and the height adjusting mechanism was used to set the distance between the conductive substrate and the high frequency introducing section at 9 mm. Glow discharge was induced in the deposition chamber in the semiconductor formation vacuum vessel 213 to form a 1-$\mu$m silicon-based film on the conductive substrate 204. Formation conditions are shown in the formation conditions for 213 in Table 1. At this time, high frequency of 60 MHz was introduced into the semiconductor formation vacuum vessel 213 through the high frequency introducing section 243, composed of a metal electrode made of Al, while adjusting the power density to 300 mW/cm³ (Comparative Example 1-2).

When the diffraction peak of each formed silicon-based film was measured using an X-ray diffracting apparatus, the silicon-based film of Comparative Example 1-1 had the highest diffraction intensity at a (400) face. Further, the (400) diffraction intensity occupied 80% of the sum of the diffraction intensities of 11 reflections starting with the smallest angle, indicating that the silicon-based film of Comparative Example 1-1 was preferentially oriented along a (100) face. Furthermore, the silicon-based film of Comparative Example 1-2 had the highest diffraction intensity at a (220) face, and the (220) diffraction intensity occupied 90% of the sum of the diffraction intensities of 11 reflections starting with the smallest angle, indicating that the silicon-based film of Comparative Example 1-2 was preferentially oriented along a (110) face.

Then, a photovoltaic element was produced. A source gas and a diluting gas were supplied to the semiconductor formation vacuum vessels 211, 212, 213, and 215 through the gas introducing pipes 231, 232, 233, and 235, while operating the evacuation system. The discharge chambers in the semiconductor formation vacuum vessels 212 and 213 each had a longitudinal length of 1 m and a transverse width of 50 cm. Further, the semiconductor formation vacuum vessels other than the ones 211, 212, 213, and 215 were supplied with 200-cm³/min (normal) $H_2$ gas through the gas introducing pipes, while simultaneously each gas gate was supplied with 500-cm³/min (normal) $H_2$ gas through gate gas supply pipes (not shown in the drawings) as gate gas. Under these conditions, the exhaust performance of the evacuation system was regulated to adjust the pressures in the semiconductor formation vacuum vessels 211, 212, 213, and 215 to predetermined values. Formation conditions are shown in Table 1.

Once the pressures in the semiconductor formation vacuum vessels 211, 212, 213, and 215 were stabilized, the conductive substrate 204 started to be moved from the substrate feeding vessel 202 toward the substrate wind-up vessel 203.

Then, high frequency from the high frequency power supplies 251, 252, 253, and 255 was introduced into the high frequency introducing sections 241, 242, 243, and 245 in the semiconductor formation vacuum vessels 211, 212, 213, and 215. Glow discharge was induced in the deposition chambers in the semiconductor formation vacuum vessels 211, 212, 213, and 215 to form on the conductive substrate 204 an amorphous n-type semiconductor layer (film thickness: 30 nm), an i-type semiconductor layer (film thickness: 1.5 $\mu$m), and a microcrystalline p-type semiconductor layer (film thickness: 10 nm), thereby forming a photovoltaic element. The i-type semiconductor layer had a total film thickness of 1.5 $\mu$m, and the film forming region adjusting plates in the semiconductor formation vacuum vessels 212 and 213 were regulated to adjust the thickness of a silicon-based film formed in each semiconductor formation vacuum vessel, as shown in Table 2 (Comparative Example 1-3 and Examples 1-1, 1-2, 1-3, and 1-4).

Then, high frequency power of frequency 13.56 MHz and power density 5 mW/cm³ was introduced into the semiconductor formation vacuum vessel 211 through the high frequency introducing section 241, composed of a metal electrode made of Al. High frequency was introduced into the semiconductor formation vacuum vessels 212 and 213 as in the case with the above described silicon-based films. High frequency power of frequency 13.56 MHz and power density 30 mW/cm³ was introduced into the semiconductor formation vacuum vessel 214 through the high frequency introducing section 244, composed of a metal electrode made of Al.

Then, a continuous module forming apparatus, not shown in the drawings, was used to form the formed belt-like photovoltaic elements into solar cell modules of 36×22 cm size.

The photoelectric conversion efficiencies of the solar cell modules produced as described above were measured using a solar simulator (AM 1.5, 100 mW/cm²). Further, the adhesion between the conductive substrate and the semiconductor layer was examined using cross cut tape tests (interval between cuts: 1 mm, the number of squares: 100). The results are shown in Table 2.

Furthermore, when the cross section of the photovoltaic element of Example 1-1 was observed using TEM, it was found that in the i-type semiconductor layer, the microcrystal located in a region formed by the semiconductor formation vacuum vessel 212 was spherical and that the microcrystal located in a region formed by the semiconductor formation vacuum vessel 213 was shaped like a column extending vertically relative to the substrate. The surface layer of each i-type semiconductor layer was preferentially oriented along the (110) face as shown in RHEED figures of samples of the photovoltaic elements, which had been formed up to the i-type semiconductor layer.

As is apparent from the above description, solar cell including the semiconductor element of the present invention has excellent characteristics. The characteristics were particularly excellent when a region preferentially oriented along the (100) face had a thickness of 1.0 nm or more and 20 nm or less.

EXAMPLE 2

Figure 5:
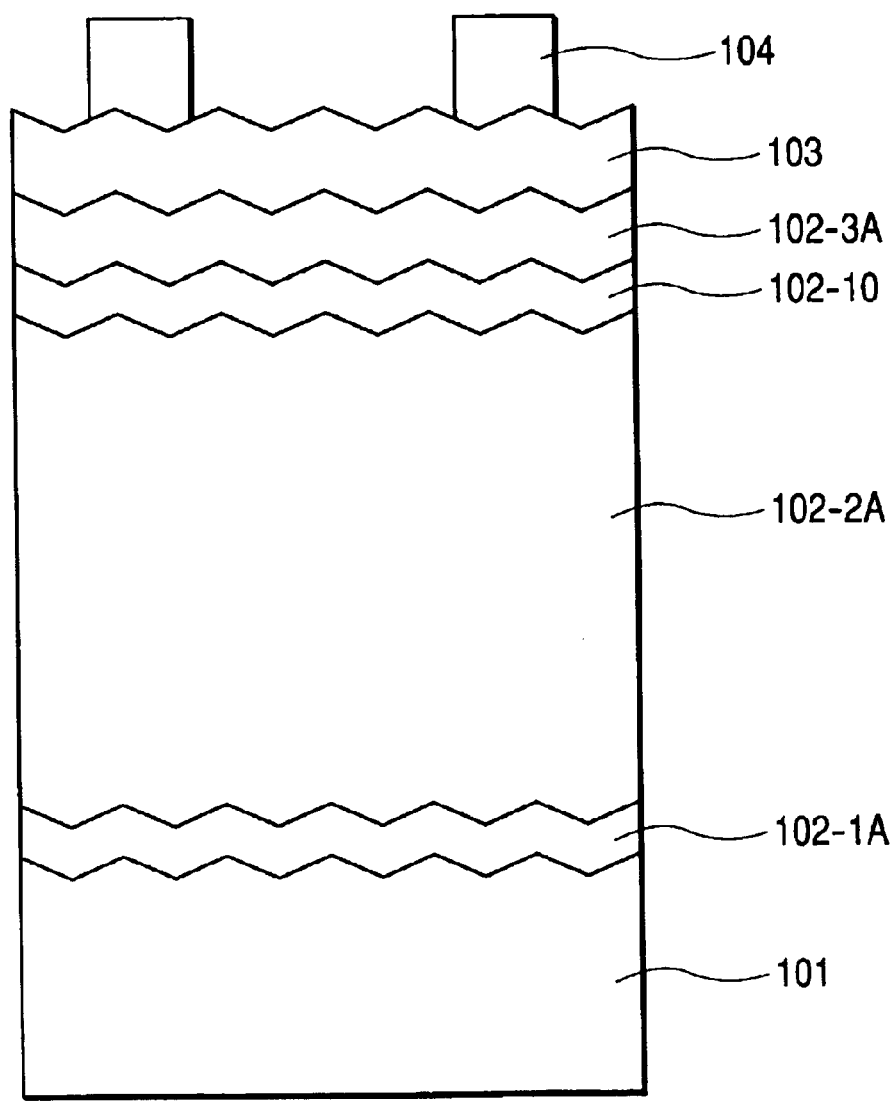
FIG. 5 is a schematic sectional view showing an example of a photovoltaic element including the semiconductor element of the present invention.

The deposited film forming apparatus 201, shown in FIG. 2, was used to form the photovoltaic element shown in FIG. 5 using the following procedure: FIG. 5 is a schematic sectional view showing an example of a photovoltaic element having the silicon-based film of the present invention. In this figure, members that are similar to those in FIG. 1 are denoted by the same reference numerals, and their description is omitted. The semiconductor layer of this photovoltaic element is composed of an amorphous n-type semiconductor layer 102-1A, a microcrystalline i-type semiconductor layer 102-2A, an amorphous silicon layer 102-10, and a microcrystalline p-type semiconductor layer 102-3A. That is, this photovoltaic element is composed of a so-called pin type single cell.

Then, high frequency from the high frequency power supplies 251 to 255 was introduced into the high frequency introducing sections 241 to 245 in the semiconductor formation vacuum vessels 211 to 215. Glow discharge was induced in the deposition chambers in the semiconductor formation vacuum vessels 211 to 215 to form on the conductive substrate 204 an amorphous n-type semiconductor layer (film thickness: 30 nm), a microcrystalline i-type semiconductor layer (film thickness: 1.5 $\mu$m), an amorphous silicon layer, and a microcrystalline p-type semiconductor layer (film thickness: 10 nm), thereby forming a photovoltaic element.

The conditions for the interior of the semiconductor formation vacuum vessels 211, 212, 213, and 215 were similar to those in Example 1-2, and the conditions for the interior of the semiconductor formation vacuum vessel 214 are shown in Table 3. Further, high frequency of 100 MHz was introduced into the semiconductor formation vacuum vessel 214 through the high frequency introducing section 245, composed of a metal electrode made of Al, while adjusting the power density to 100 mW/cm³. Then, the film forming region adjusting plate in the semiconductor formation vacuum vessel 214 was used to form photovoltaic elements with the film thicknesses shown in Table 4. Next, the continuous module forming apparatus, not shown in the drawings, was used to form the formed belt-like photovoltaic elements into solar cell modules of 36×22 cm size (Examples 2-1, 2-2, 2-3, and 2-4).

The photoelectric conversion efficiencies of the solar cell modules produced as described above were measured using the solar simulator (AM 1.5, 100 mW/cm²). Further, the solar cell modules, the initial photoelectric conversion efficiencies of which had previously been measured, were retained at 50° C. and then irradiated with solar simulator light of AM 1.5 and 100 mW/cm² for 500 hours. Subsequently, the photoelectric conversion efficiencies were measured again to examine changes in photoelectric conversion efficiency associated with the photodegradation test. The results are shown in Table 4.

As is apparent from the above description, solar cells including the semiconductor element of the present invention have excellent characteristics. The characteristics were particularly excellent when the amorphous silicon layer had a thickness of 30 nm or less.

EXAMPLE 3

The deposited film forming apparatus 201, shown in FIG. 2, was used to form the photovoltaic element shown in FIG. 4.

The formation method was similar to that in Example 1-2 except that $SiF_4$ gas was introduced into the semiconductor formation vacuum vessel 213 together with oxygen the amount of which is shown in Table 5. Then, the continuous module forming apparatus, not shown in the drawings, was used to form the formed belt-like photovoltaic elements into solar cell modules of 36×22 cm size (Examples 3-1, 3-2, 3-3, and 3-4).

The photoelectric conversion efficiencies of the solar cell modules produced as described above were measured using the solar simulator (AM 1.5, 100 mW/cm²). Further, the solar cell modules, the initial photoelectric conversion efficiencies of which had previously been measured, were installed in a dark place at a temperature of 85° C. and a humidity of 85% and held there for 30 minutes. Then, 70 minutes were spent reducing the temperature down to −20° C., and then the solar cell modules were held there for 30 minutes. Then, 70 minutes were spent again returning the temperature and humidity to the initial values, i.e. 85° C. and 85%. This cycle was repeated 100 times and then the photoelectric conversion efficiencies were measured again to examine changes in photoelectric conversion efficiency associated with the temperature-humidity test. Further, the solar cell modules were subjected to SIMS measurements to evaluate the concentration of oxygen contained in the silicon-based film formed by the semiconductor formation vacuum vessel 213. The results are shown in Table 6.

Furthermore, when the cross sections of the solar cell modules were observed using TEM, it was found that in the i-type semiconductor layer, the microcrystal located in a region formed by the semiconductor formation vacuum vessel 212 was spherical and that the microcrystal located in a region formed by the semiconductor formation vacuum vessel 213 was shaped like a column extending vertically relative to the substrate. It has been found that the substantially columnar shapes of the solar cell modules of Examples 3-1, 3-2, and 3-3 have a better uniformity in size than those of Examples 1-2 and 3-4.

As is apparent from the above description, solar cells including the semiconductor element of the present invention have excellent characteristics. The characteristics were particularly excellent when the film had an oxygen concentration of $1.5 \times 10^{18}$ atoms/cm³ or more and $5.0 \times 10^{19}$ atoms/cm³ or less.

EXAMPLE 4

The deposited film forming apparatus 201, shown in FIG. 2, was used to form the photovoltaic element shown in FIG. 4.

The formation method was similar to that in Example 1-2 except that the source gas shown in Table 7 was introduced into the semiconductor formation vacuum vessel 213. Then, the continuous module forming apparatus, not shown in the drawings, was used to form the formed belt-like photovoltaic elements into solar cell modules of 36×22 cm size (Examples 4-1, 4-2, 4-3, 4-4, and 4-5).

The photoelectric conversion efficiencies of the solar cell modules produced as described above were measured using the solar simulator (AM 1.5, 100 mW/cm²). Further, the solar cell modules, the initial photoelectric conversion efficiencies of which had previously been measured, were installed in a dark place at a temperature of 85° C. and a humidity of 85% and held there for 30 minutes. Then, 70 minutes were spent reducing the temperature down to −20° C., and then the solar cell modules were held there for 30 minutes. Then, 70 minutes were spent again returning the temperature and humidity to the initial values, i.e. 85° C. and 85%. This cycle was repeated 100 times and then the photoelectric conversion efficiencies were measured again to examine changes in photoelectric conversion efficiency associated with the temperature-humidity test. Further, the solar cell modules were subjected to SIMS measurements to evaluate the concentration of fluorine contained in the silicon-based film formed by the semiconductor formation vacuum vessel 213. The results are shown in Table 7.

As is apparent from the above description, solar cells including the semiconductor element of the present invention have excellent characteristics. The characteristics were particularly excellent when the film had a fluorine concentration of $1.0 \times 10^{19}$ atoms/cm³ or more and $2.5 \times 10^{20}$ atoms/cm³ or less.

EXAMPLE 5

The deposited film forming apparatus 201, shown in FIG. 2, was used to form the photovoltaic element shown in FIG. 4.

The formation method was similar to that in Example 2-2 except that, when an i-type semiconductor layer was formed in the semiconductor formation vacuum vessel 213, transportation of the conductive substrate was stopped and the flow rate ratio of gas introduced into the semiconductor formation vacuum vessel 213 was varied as shown in Table 8, while varying the (220) face orientation property so that this orientation becomes gradually large in the film formation direction. In this case, the flow rate of each gas was linearly varied from the start to end of film formation. Then, the continuous module forming apparatus, not shown in the drawings, was used to form the formed belt-like photovoltaic element into a solar cell module of 36×22 cm size (Example 5).

The photoelectric conversion efficiency of the solar cell module produced as described above was measured using the solar simulator (AM 1.5, 100 mW/cm$^2$). It has been found that the solar cell module of Example 5 has a photoelectric conversion efficiency 1.1 times as high as that of Example 2-2.

As is apparent from the above description, solar cells including the semiconductor element of the present invention have excellent characteristics.

EXAMPLE 6

Figure 6:
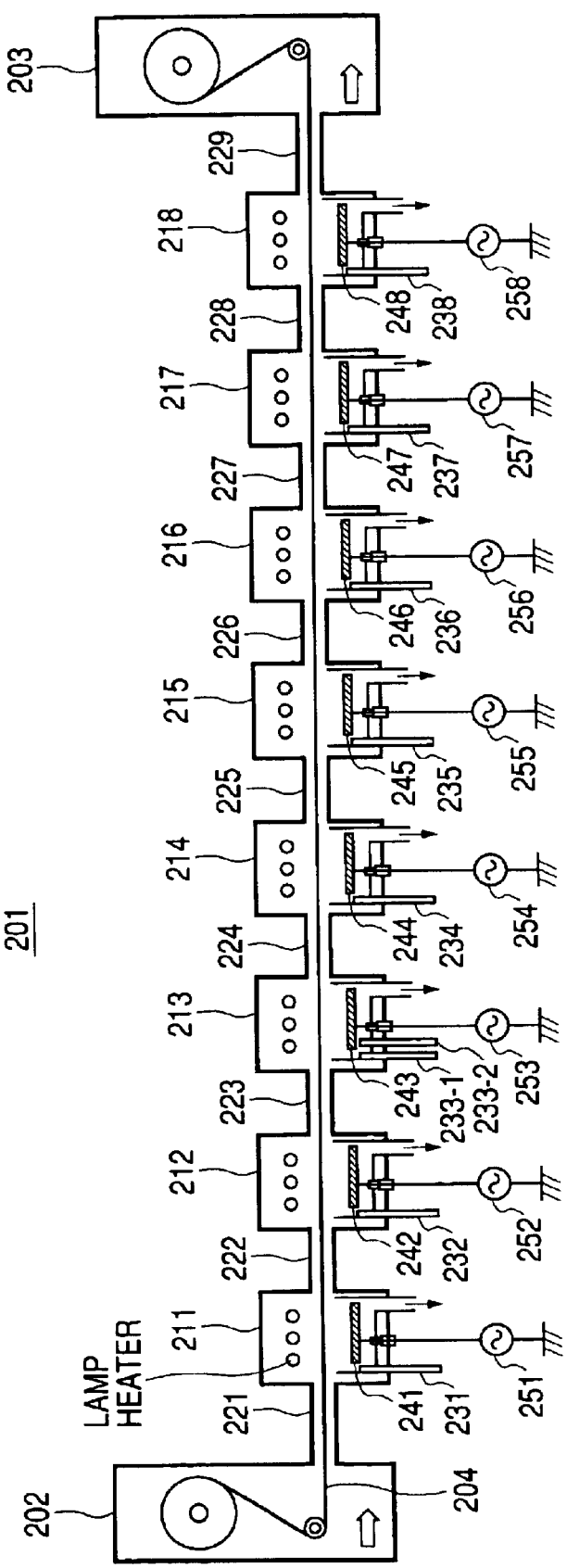
FIG. 6 is a schematic sectional view showing an example of a deposited film forming apparatus for manufacturing the semiconductor element and photovoltaic element of the present invention.

The deposited film forming apparatus 201, shown in FIG. 6, was used to form the photovoltaic element shown in FIG. 4.

The formation method was similar to that in Example 2-2 except that two gas introducing pipes (233-1 and 233-2) were connected to the interior of the semiconductor formation vacuum vessel 213, the gas introducing pipe 233-1 was arranged upstream of the gas introducing pipe 232-2 in the direction in which the conductive substrate was transported, while changing the flow rate ratio of the source gas flowing through the gas introducing pipes as shown in Table 9 so that the density of the activated species in the plasma of the semiconductor formation vacuum vessel 213 varies in the direction in which the conductive substrate was transported. The formed belt-like photovoltaic element was formed into a solar cell module of 36×22 cm size (Example 6).

The photoelectric conversion efficiency of the solar cell module produced as described above was measured using the solar simulator (AM 1.5, 100 mW/cm$^2$). It has been found that the solar cell module of Example 6 has a photoelectric conversion efficiency 1.15 times as high as that of Example 2-2.

As is apparent from the above description, solar cells including the semiconductor element of the present invention have excellent characteristics.

EXAMPLE 7

The deposited film forming apparatus 201, shown in FIG. 2, was used to form the photovoltaic element shown in FIG. 4.

The formation method was similar to that in Example 2-2 except that the temperature of a lamp heater in the semiconductor formation vacuum vessel 213 was adjusted so that the temperature in the semiconductor formation vacuum vessel 213 was high at the start of film formation (i.e. at an upstream location in the transportation direction) and low at the end of film formation (i.e. at a downstream location in the transportation direction). The formation conditions in the semiconductor formation vacuum vessel 213 are shown in Table 10. The formed belt-like photovoltaic element was formed into a solar cell module of 36×22 cm size (Example 7).

The photoelectric conversion efficiency of the solar cell module produced as described above was measured using the solar simulator (AM 1.5, 100 mW/cm$^2$). It has been found that the solar cell module of Example 7 has a photoelectric conversion efficiency 1.25 times as high as that of Example 2-2.

As is apparent from the above description, solar cells including the semiconductor element of the present invention have excellent characteristics.

EXAMPLE 8

The deposited film forming apparatus 201, shown in FIG. 2, was used to form the photovoltaic element shown in FIG. 4.

The formation method was similar to that in Example 2-2 except that the height adjusting mechanisms in the semiconductor formation vacuum vessels 212 and 213 were used to vary the distance between the conductive substrate and the high frequency introducing section as shown in Table 11. The formed belt-like photovoltaic elements were formed into solar cell modules of 36×22 cm size.

The photoelectric conversion efficiencies of the solar cell modules produced as described above were measured using the solar simulator (AM 1.5, 100 mW/cm$^2$). The results are shown in Table 10. An i-type semiconductor layer obtained by setting the above distance at 2 mm had a nonuniform thickness and caused the photoelectric conversion efficiency to significantly vary among the solar cell modules. Solar cell modules obtained by setting the distance between the conductive substrate and the high frequency introducing section at 3 mm or more and 30 mm or less had high photoelectric conversion efficiencies.

As is apparent from the above description, solar cells including the semiconductor element of the present invention have excellent characteristics.

EXAMPLE 9

The deposited film forming apparatus 201, shown in FIG. 2, was used to form the photovoltaic element shown in FIG. 4.

The formation method was similar to that in Example 2-2 except that the pressure in the semiconductor formation vacuum vessel 213 was varied as shown in Table 12. The formed belt-like photovoltaic elements were formed into solar cell modules of 36×22 cm size.

The photoelectric conversion efficiencies of the solar cell modules produced as described above were measured using the solar simulator (AM 1.5, 100 mW/cm$^2$). Further, the adhesion between the conductive substrate and the semiconductor layer was examined using cross cut tape tests (interval between cuts: 1 mm, the number of squares: 100). Furthermore, the solar cell modules, the initial photoelectric conversion efficiencies of which had previously been measured, were installed in a dark place at a temperature of 85° C. and a humidity of 85% and held there for 30 minutes. Then, 70 minutes were spent reducing the temperature down to −20° C., and then the solar cell modules were held there for 30 minutes. Then, 70 minutes were spent again returning the temperature and humidity to the initial values, i.e. 85° C. and 85%. This cycle was repeated 100 times and then the photoelectric conversion efficiencies were measured again to examine changes in photoelectric conversion efficiency associated with the temperature-humidity test. The results are shown in Table 12.

Table 12 indicates that solar cell modules including photovoltaic elements produced by setting the pressure in the semiconductor formation vacuum vessel 213 at 90 Pa or more and 15,000 Pa or less have a high photoelectric conversion efficiency and show high performance in peel-off tests and temperature-humidity tests. In particular, solar cell modules including photovoltaic elements produced by setting the pressure at 100 Pa or more and 5,000 Pa or less show excellent characteristics in peel-off tests. As is apparent from the above description, solar cell modules including the semiconductor element of the present invention have excellent characteristics.

EXAMPLE 10

The deposited film forming apparatus 201, shown in FIG. 2, was used to form the photovoltaic element shown in FIG. 4.

The formation method was similar to that in Example 2-2 except that the residence time in semiconductor formation vacuum vessels 212 and 213 was varied as shown in Table 13. The formed belt-like photovoltaic elements were formed into solar cell modules of 36×22 cm size.

Table 13 indicates that solar cell modules including photovoltaic elements produced by setting the residence time in the semiconductor formation vacuum vessel 212 at 0.1 second or more and 10 seconds or less have a high photoelectric conversion efficiency, show high performance in peel-off tests and temperature-humidity tests, and have a low photodegradation rate. In particular, solar cell modules including photovoltaic elements produced by setting the residence time at 0.2 second or more and 3.0 seconds or less show excellent characteristics in peel-off tests. As is apparent from the above description, solar cell modules including the semiconductor element of the present invention have excellent characteristics.

EXAMPLE 11

Figure 7:
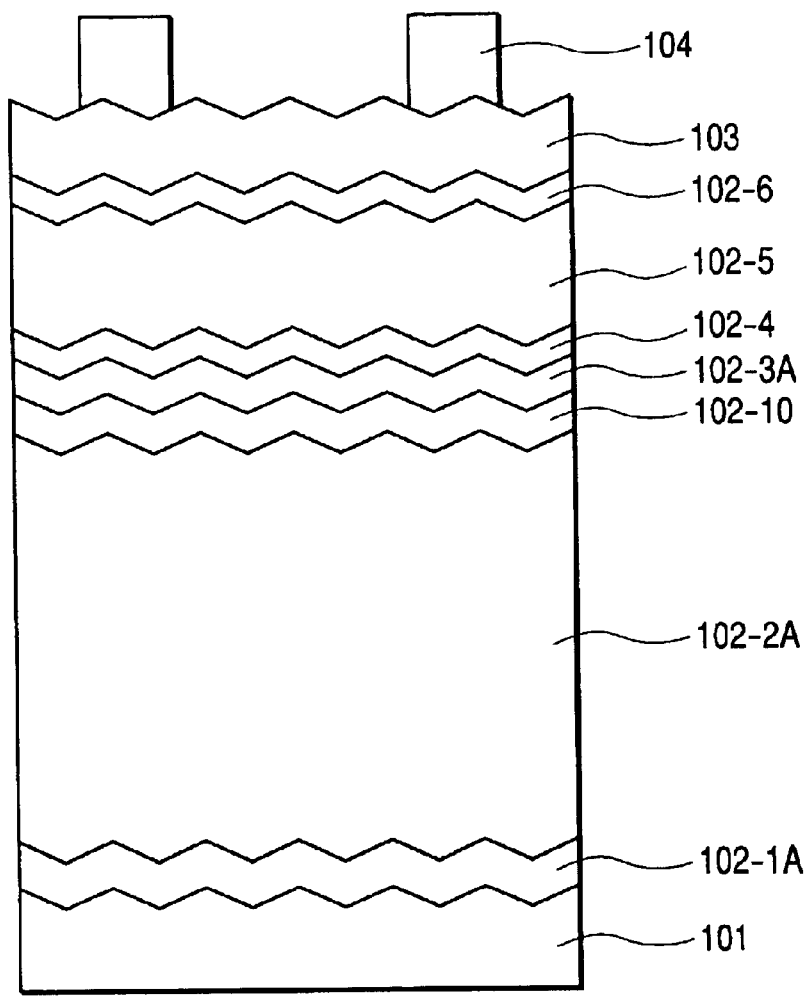
FIG. 7 is a schematic sectional view showing an example of a photovoltaic element including the semiconductor element of the present invention.

The deposited film forming apparatus 201, shown in FIG. 2, was used to form the photovoltaic element shown in FIG. 5 using the following procedure: FIG. 7 is a schematic sectional view showing an example of a photovoltaic element having the silicon-based film of the present invention. In this figure, members that are similar to those in FIG. 1 are denoted by the same reference numerals, and their description is omitted. The semiconductor layer of this photovoltaic element is composed of amorphous n-type semiconductors layers 102-1A and 102-4, the microcrystalline i-type semiconductor layer 102-2A, an amorphous i-type semiconductor layer 102-5, the amorphous silicon layer 102-10, and microcrystalline p-type semiconductor layers 102-3A and 102-6. That is, this photovoltaic element is composed of a so-called pinpin type double cell.

As in Example 1, the belt-like conductive substrate 204 was produced and installed in the deposited film forming apparatus 201, and the substrate feeding vessel 202, the semiconductor formation vacuum vessels 211, 212, 213, 214, 215, 216, 217, and 218, and the substrate wind-up vessel 203 were sufficiently evacuated down to $6.7 \times 10^{-4}$ Pa ($5 \times 10^{-6}$ Torr) or less using the evacuation system composed of the vacuum pump, not shown in the drawings.

Then, a source gas and a diluting gas were supplied to the semiconductor formation vacuum vessels 211 to 218 through the gas introducing pipes 231 to 238 while operating the evacuation system. The discharge chambers in the semiconductor formation vacuum vessels 212 and 213 each had a longitudinal length of 1 m and a transverse width of 50 cm. The gas gates were supplied with 500-cm³/min (normal) $H_2$ gas through gate gas supply pipes (not shown in the drawings) as gate gas. Under these conditions, the exhaust performance of the evacuation system was regulated to adjust the pressures in the semiconductor formation vacuum vessels 211 to 216 to predetermined values. Formation conditions for the semiconductor formation vacuum vessels 211 to 215 were similar to those in Example 2-2. Formation conditions for the semiconductor formation vacuum vessels 216 to 218 are shown in Table 14.

Once the pressures in the semiconductor formation vacuum vessels 211 to 218 were stabilized, the conductive substrate 204 started to be moved from the substrate feeding vessel 202 toward the substrate wind-up vessel 203.

Then, high frequency from the high frequency power supplies 251 to 258 was introduced into the high frequency introducing sections 241 to 248 in the semiconductor formation vacuum vessels 211 to 218. Glow discharge was induced in the deposition chambers in the semiconductor formation vacuum vessels 211 to 218 to form on the substrate 204 an amorphous n-type semiconductor layer (film thickness: 30 nm), a microcrystalline i-type semiconductor layer (film thickness: 2.0 $\mu$m), a microcrystalline p-type semiconductor layer (film thickness: 10 nm), an amorphous n-type semiconductor layer (film thickness: 30 nm), an amorphous i-type semiconductor layer (film thickness: 300 nm), and a microcrystalline p-type semiconductor layer (film thickness: 10 nm), thereby forming a photovoltaic element. A 10-nm thick microcrystal i-type semiconductor layer was formed in the semiconductor formation vacuum vessel 212. Then, high frequency power of frequency 13.56 MHz and power density 5 mW/cm³ was introduced into the semiconductor formation vacuum vessels 211 and 216 through the high frequency introducing sections 241 and 246, composed of metal electrodes made of Al. High frequency of 60 MHz was introduced into the semiconductor formation vacuum vessel 212 through the high frequency introducing section 242, composed of a metal electrode made of Al, while adjusting the power density to 400 mW/cm³. High frequency of 60 MHz was introduced into the semiconductor formation vacuum vessel 213 through the high frequency introducing section 243, composed of a metal electrode made of Al, while adjusting the power density to 300 mW/cm³. High frequency of 100 MHz was introduced into the semiconductor formation vacuum vessels 214 and 217 through the high frequency introducing sections 244 and 247, composed of metal electrodes made of Al, while adjusting the power density to 100 mW/cm³. High frequency power of frequency 13.56 MHz and power density 30 mW/cm³ was introduced into the semiconductor formation vacuum vessels 215 and 218 through the high frequency introducing sections 245 and 248, composed of metal electrodes made of Al. Then, the continuous module forming apparatus, not shown in the drawings, was used to form the formed belt-like photovoltaic element into a solar cell module of 36×22 cm size.

When the photoelectric conversion efficiency of the solar cell module produced as described above was measured using the solar simulator (AM 1.5, 100 mW/cm²), this solar cell module had a photoelectric conversion efficiency 1.2 times as high as a single solar cell module of Example 2-2. Further, this solar cell module showed high performance in peel-off tests and temperature-humidity tests, indicating that solar cell modules including the semiconductor element of the present invention have excellent characteristics.

EXAMPLE 12

Figure 8:
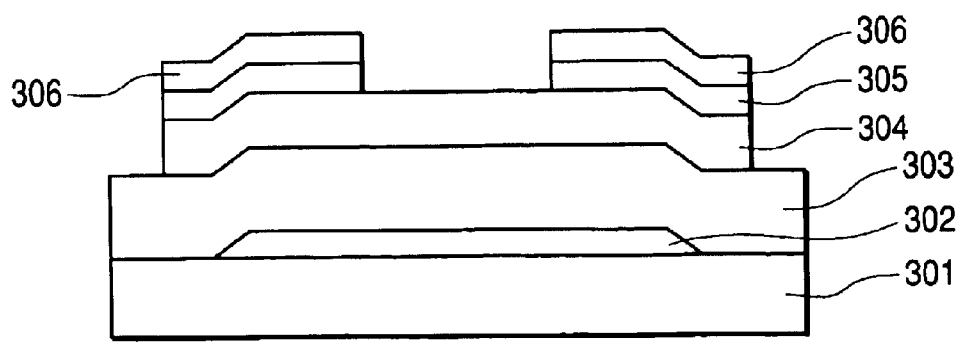
FIG. 8 is a schematic sectional view showing an example of a TFT including the semiconductor element of the present invention.

An inverse staggered TFT was formed using the following procedure. FIG. 8 is a schematic sectional view showing an example of an inverse staggered TFT having the semiconductor element of the present invention. As an insulating substrate, a glass substrate 301 is used, on which a gate electrode 302 is formed. Furthermore, on the gate electrode 302 are formed a gate insulating film 303, an activated layer 304 composed of an undoped silicon layer, an Ohmic contact layer 305 arranged in a source-drain region on the activated layer 304 and composed of $n^+$-type amorphous silicon having a small resistance, and a source-drain electrode 306.

First, an Mo—Ta alloy film layer was formed on the glass substrate 301 by a sputtering process and then patterned to form the gate electrode 302. Then, using a CVD process, the gate insulating film 303, composed of a silicon oxide film, was formed. Subsequently, the glass substrate was set in the semiconductor formation vacuum vessel 212 shown in FIG. 2, and then a 15-nm silicon-based film preferentially oriented along the (100) face as in Example 1 was formed. Then, the glass substrate was set in the semiconductor formation vacuum vessel 213, and a 65-nm silicon-based film preferentially oriented along the (110) face as in Example 1 was formed, thus obtaining the activated layer 304, having a thickness of 80 nm. Then, the glass substrate was set in the semiconductor formation vacuum vessel 211, and the Ohmic contact layer 305, composed of $n^+$-type amorphous silicon, was deposited and patterned through a lithography process. Furthermore, a metal film was formed and patterned to form the source-drain electrode 306. Finally, a mixed gas of $CF_4$ and $O_2$ was used to etch the Ohmic contact layer 305, exposed from the source-drain electrode 306, to form a TFT (Example 12).

A TFT was formed similarly to Example 12 except that the activated layer 304 was formed of an amorphous silicon layer so as to have a thickness of 80 nm (Comparative Example 12-1).

A TFT was formed similarly to Example 12 except that the activated layer 304 was formed only of a silicon-based film preferentially oriented along the (100) face, so as to have a thickness of 80 nm (Comparative Example 12-2).

When the Ohmic contact layer 305 was etched, in the TFT of Example 12, the activated layer 304 was not overetched, whereas in the TFTs of the comparative examples, it was overetched, and was thus thinner and had a nonuniform film thickness. In particular, the TFT of Comparative Example 12-1 was significantly overetched. Further, the etching damage resulted in the formation of a leak path in the activated layer, thus increasing the value of off current compared to Example 12.

As is apparent from the above description, TFTs including the semiconductor element of the present invention have excellent characteristics.

TABLE 1

| Formation conditions for 211 | Source gas | $SiH_4$: 20 cm³/min (normal)<br>$H_2$: 100 cm³/min (normal)<br>$PH_3$ (Diluted to 2% with $H_2$): 30 cm³/min (normal) |
|---|---|---|
| | Substrate temperature | 300° C. |
| | Pressure | 133 Pa (1.0 Torr) |
| Formation conditions for 212 | Source gas | $SiF_4$: $H_2$ = 10:1<br>τ = 0.3 second |
| | Substrate temperature | 300° C. |
| | Pressure | 200 Pa (1.5 Torr) |
| Formation conditions for 213 | Source gas | $SiH_4$: $SiF_4$: $H_2$ = 1:5:15<br>τ = 0.4 second |
| | Substrate temperature | 350° C. |
| | Pressure | 200 Pa (1.5 Torr) |
| Formation conditions for 215 | Source gas | $SiH_4$: 10 cm³/min (normal)<br>$H_2$: 800 cm³/min (normal)<br>$BF_3$ (Diluted to 2% with $H_2$): 100 cm³/min (normal) |
| | Substrate temperature | 200° C. |
| | Pressure | 160 Pa (1.2 Torr) |

TABLE 2

| | Comparative Example 1-3 | Example 1-1 | Example 1-2 | Example 1-3 | Example 1-4 |
|---|---|---|---|---|---|
| Thickness of film formed in 212 (nm) | 0 | 1.0 | 10 | 20 | 50 |
| Photoelectric conversion efficiency | 1 | 1.30 | 1.35 | 1.32 | 1.10 |
| Peel-off test | B | AA | AA | AA | A |

The photoelectric conversion efficiencies have been standardized by setting the value for Comparative Example 1-3 to 1. For the peel-off tests, the symbols AA, A, B and C indicate that the number of peeled-off squares is 0, 1 to 2, 3 to 10 and 10 to 100, respectively.

TABLE 3

| Formation conditions for 214 | Source gas | $SiH_4$: 200 cm³/min (normal)<br>$H_2$: 1000 cm³/min (normal) |
|---|---|---|
| | Substrate temperature | 300° C. |
| | Pressure | 1000 Pa (7.5 Torr) |

TABLE 4

| | Example 2-1 | Example 2-2 | Example 2-3 | Example 2-4 |
|---|---|---|---|---|
| Thickness of film formed in 214 (nm) | 0 | 10 | 30 | 50 |
| Photoelectric conversion efficiency | 1 | 1.10 | 1.15 | 1.15 |
| Photodegradation rate | 1 | 1.05 | 1.05 | 1.20 |

The photoelectric conversion efficiencies and photodegradation rates have been standardized by setting the value for Comparative Example 2-1 to 1.

TABLE 5

| $SiF_4$ gas (Example 3-1) | $SiF_4$ introduced with 0.1-ppm oxygen |
|---|---|
| $SiF_4$ gas (Example 3-2) | $SiF_4$ introduced with 0.3-ppm oxygen |
| $SiF_4$ gas (Example 3-3) | $SiF_4$ introduced with 0.7-ppm oxygen |
| $SiF_4$ gas (Example 3-4) | $SiF_4$ introduced with 1.0-ppm oxygen |

TABLE 6

| | Example 1-2 | Example 3-1 | Example 3-2 | Example 3-3 | Example 3-4 |
|---|---|---|---|---|---|
| Concentration of oxygen in film (atoms/cm³) | $1.0 \times 10^{18}$ | $1.5 \times 10^{18}$ | $7.0 \times 10^{18}$ | $5.0 \times 10^{19}$ | $7.0 \times 10^{19}$ |
| Initial photoelectric conversion efficiency | 1 | 1.10 | 1.15 | 1.15 | 1.05 |

TABLE 6-continued

|  | Example 1-2 | Example 3-1 | Example 3-2 | Example 3-3 | Example 3-4 |
|---|---|---|---|---|---|
| Changes of photoelectric conversion efficiency in temperature-humidity test (Efficiency after test/initial efficiency) | 0.95 | 1.0 | 1.0 | 1.0 | 0.95 |

TABLE 7

|  | Example 4-1 | Example 4-2 | Example 4-3 | Example 4-4 | Example 4-5 |
|---|---|---|---|---|---|
| Source gas for 213 $SiH_4$: $SiF_4$: $H_2$ | 1:1:15 | 1:2:15 | 1:3:15 | 1:4:15 | 1:5:15 |
| τ (second) | 0.8 sec | 0.8 sec | 0.8 sec | 0.8 sec | 0.8 sec |
| Concentration of fluorine in thin film (atoms/cm$^3$) | $7.5 \times 10^{18}$ | $1.0 \times 10^{19}$ | $8.0 \times 10^{16}$ | $2.5 \times 10^{20}$ | $5.0 \times 10^{20}$ |
| Initial photoelectric efficiency | 1 | 1.15 | 1.20 | 1.15 | 1.05 |
| Changes of photoelectric conversion efficiency in temperature-humidity test (Efficiency after test/initial efficiency) | 0.95 | 1.0 | 1.0 | 1.0 | 0.98 |

TABLE 8

| Formation conditions for 213 | Source gas | At start of film formation: $SiH_4$: $SiF_4$: $H_2$ = 1:3:10, τ = 0.4 second<br>At end of film formation: $SiH_4$: $SiF_4$: $H_2$ = 1:5:15, τ = 0.4 second |
|---|---|---|
|  | Substrate temperature | 350° C. |
|  | Pressure | 200 Pa (1.5 Torr) |

TABLE 9

| Formation conditions for 213 | Source gas | 233-1: $SiH_4$: $SiF_4$: $H_2$ = 1:3:10<br>233-2: $SiF_4$: $H_2$ = 1:4<br>τ = 0.4 second |
|---|---|---|
|  | Substrate temperature | 350° C. |
|  | Pressure | 200 Pa (1.5 Torr) |

TABLE 10

| Formation conditions for 213 | Source gas | $SiH_4$: $SiF_4$: $H_2$ = 1:5:15<br>τ = 0.4 second |
|---|---|---|
|  | Substrate temperature | 350° C. (at start of film formation) → 250° C. (at end of film formation) |
|  | Pressure | 200 Pa (1.5 Torr) |

TABLE 11

| Distance between conductive substrate and high frequency introducing section (mm) | 2 | 3 | 6 | 9 | 15 | 30 | 50 |
|---|---|---|---|---|---|---|---|
| Photoelectric conversion efficiency | — | 1 | 1.05 | 1.10 | 1.15 | 1.10 | 0.7 |

The values have been standardized by setting the value obtained when the distance between the conductive substrate and the high frequency introducing section is 3 mm, to 1.

TABLE 12

| Pressure in semiconductor formation vessel 213 (Pa) | 50 | 90 | 100 | 1000 | 5000 | 10000 | 15000 | 20000 |
|---|---|---|---|---|---|---|---|---|
| Photoelectric conversion efficiency | 1 | 1.25 | 1.40 | 1.45 | 1.50 | 1.45 | 1.40 | 0.9 |
| Peel-off tests | C | A | AA | AA | AA | A | A | B |
| Temperature-humidity tests | 0.70 | 0.90 | 1.0 | 1.0 | 1.0 | 0.95 | 0.9 | 0.75 |

The photoelectric conversion efficiencies have been standardized by setting the value obtained when the pressure in the semiconductor formation vacuum vessel 213 is 50 Pa, to 1. For the peel-off tests, the symbols AA, A, B and C indicate that the number of peeled-off squares is 0, 1 to 2, 3 to 10 and 10 to 100, respectively. The results of the temperature-humidity tests show the values of (photoelectric conversion efficiency after the test)/(photoelectric conversion efficiency before the test).

TABLE 13

| Residence time (second) in semiconductor formation vessels 212 and 213 | 0.008 | 0.01 | 0.1 | 1.0 | 3.0 | 10 | 15 |
|---|---|---|---|---|---|---|---|
| Photoelectric conversion efficiency | 1 | 1.50 | 1.55 | 1.60 | 1.50 | 1.35 | 0.80 |
| Peel-off tests | B | A | AA | AA | AA | A | C |
| Temperature-humidity tests | 0.7 | 0.9 | 1.0 | 1.0 | 1.0 | 1.0 | 0.7 |

The photoelectric conversion efficiencies have been standardized by setting the value obtained when the residence time in the semiconductor formation vacuum vessels 212 and 213 is 0.008 second, to 1. For the peel-off tests, the symbols AA, A, B and C indicate that the number of peeled-off squares is 0, 1 to 2, 3 to 10 and 10 to 100, respectively. The results of the temperature-humidity tests show the values of (photoelectric conversion efficiency after the test)/(photoelectric conversion efficiency before the test).

TABLE 14

| Formation conditions for 216 | Source gas | $SiH_4$: 20 cm$^3$/min (normal)<br>$H_2$: 100 cm$^3$/min (normal)<br>$PH_3$ (Diluted to 2% with $H_2$): 50 cm$^3$/min (normal) |
|---|---|---|
| | Substrate temperature | 300° C. |
| | Pressure | 133 Pa (1.0 Torr) |
| Formation conditions for 217 | Source gas | $SiH_4$: 300 cm$^3$/min (normal)<br>$H_2$: 4000 cm$^3$/min (normal) |
| | Substrate temperature | 300° C. |
| | Pressure | 1500 Pa (11.3 Torr) |
| Formation conditions for 218 | Source gas | $SiH_4$: 10 cm$^3$/min (normal)<br>$H_2$: 800 cm$^3$/min (normal)<br>$BF_3$ (Diluted to 2% with $H_2$): 100 cm$^3$/min (normal) |
| | Substrate temperature | 200° C. |
| | Pressure | 160 Pa (1.2 Torr) |

EXAMPLE 13

The deposited film forming apparatus 201, shown in FIG. 2, was used to form the photovoltaic element shown in FIG. 4, using the following procedure: FIG. 4 is a schematic sectional view showing an example of a photovoltaic element having the silicon-based film of the present invention. In this figure, members that are similar to those in FIG. 1 are denoted by the same reference numerals, and their description is omitted. The semiconductor layer of this photovoltaic element is composed of the amorphous n-type semiconductor layer 102-1A, the microcrystalline i-type semiconductor layer 102-2A, and the microcrystalline p-type semiconductor layer 102-3A. That is, this photovoltaic element is composed of a so-called pin type single cell.

FIG. 2 is a schematic sectional view showing an example of the deposited film forming apparatus that manufactures the silicon-based film and photovoltaic element of the present invention. The deposited film forming apparatus 201, shown in FIG. 2, is composed of the substrate feeding vessel 202, the semiconductor formation vacuum vessels 211 to 218, and the substrate wind-up vessel 203, which are all joined together via the gas gates 221 to 229. The deposited film forming apparatus 201 has the belt-like conductive substrate 204 set therein so as to penetrate the vessels and gas gates. The belt-like conductive substrate 204 is wound off from a bobbin installed in the substrate feeding vessel 202 and then wound up around another bobbin in the substrate wind-up vessel 203.

The semiconductor formation vacuum vessels 211 to 218 each have a deposition chamber in which a plasma induced region is formed. The deposition chamber is constructed so that a discharge space with plasma induced therein is vertically defined by the conductive substrate and high frequency introducing sections and transversely defined by the discharge plate installed so as to enclose the high frequency introducing section.

In the plate-like high frequency introducing sections 241 to 248 in the respective deposition chambers, high frequency power supplies 251 to 258 apply high frequency power to induce glow discharge, thereby decomposing source gas to deposit a semiconductor layer on the conductive substrate 204. The high frequency introducing sections 241 to 248 are opposite the conductive substrate 204 and each comprise a height adjusting mechanism, not shown in the drawings. The height adjusting mechanisms enable the distance between the conductive substrate and the high frequency introducing sections to be varied, while simultaneously enabling the volume of the discharge space to be varied. Further, the semiconductor formation vacuum vessels 211 to 218 have the gas introducing pipes 231 to 238, respectively, connected thereto to introduce a source gas and a diluting gas.

The deposited film forming apparatus 201, shown in FIG. 2, comprises eight semiconductor formation vacuum vessels, but in the following examples, glow discharge need not be induced in all the semiconductor formation vacuum vessels. Whether or not glow discharge is induced in a particular vessel can be selected in accordance with the layer configuration of a photovoltaic element to be manufactured. Further, each semiconductor formation vacuum vessel is provided with a film forming region adjusting plate, not shown in the drawings, for adjusting the contact area between the conductive substrate 204 and discharge space in the deposition chamber.

First, before forming a photovoltaic element, the silicon-based film was experimented and checked for an orientation property. A belt-like base member (50 cm in width, 200 m in length, and 0.125 mm in thickness) composed of stainless steel (SUS430BA) was sufficiently degreased and washed, and then installed in the continuous sputtering apparatus, not shown in the drawings. Then, an Ag electrode was used as a target to deposit a thin Ag film of 100 nm thick on the base member by sputtering. Furthermore, a ZnO target was used to deposit a thin ZnO film of 1.2 $\mu$m thick on the thin Ag film by sputtering to form the belt-like conductive substrate 204.

Then, a bobbin around which the conductive substrate 204 had been wound was installed in the substrate feeding vessel 202, and the conductive substrate 204 was passed through the loading gas gate, the semiconductor formation vacuum vessels 211, 212, 213, 214, 215, 216, 217 and 218, and the unloading gas gate to the substrate wind-up vessel 203, and tension was then adjusted so as not to slacken the belt-like conductive substrate 204. Then, the substrate feeding vessel 202, the semiconductor formation vacuum vessels 211, 212, 213, 214, 215, 216, 217 and 218, and the substrate wind-up vessel 203 were sufficiently evacuated down to 6.7×10$^{-4}$ Pa (5×10$^{-6}$ Torr) or less using the evacuation system composed of a vacuum pump, not shown in the drawings.

Then, a source gas and a diluting gas were supplied to the semiconductor formation vacuum vessel 212 through the gas introducing pipe 232 while operating the evacuation system. The deposition chamber in the semiconductor formation vacuum vessel 212 had a longitudinal length of 1 m and a transverse width of 50 cm. The semiconductor formation vacuum vessels other than the one 212 were supplied with 200-cm$^3$/min (normal) H$_2$ gas through gas introducing pipes, while simultaneously each gas gate was supplied with 500-cm$^3$/min (normal) H$_2$ gas through the gate gas supply pipes (not shown in the drawings) as gate gas. Under these conditions, the exhaust performance of the evacuation system was regulated to adjust the pressure in the semiconductor formation vacuum vessel 212 to a predetermined value. Formation conditions are shown in Sample 15-1 in the formation conditions for 212 in Table 15.

Once the pressure in the semiconductor formation vacuum vessel 212 was stabilized, the conductive substrate 204 started to be moved from the substrate feeding vessel 202 toward the substrate wind-up vessel 203.

Then, high frequency from the high frequency power supply 252 was introduced into the high frequency introducing section 242 in the semiconductor formation vacuum vessel 212, and the height adjusting mechanism was used to set the distance between the conductive substrate and the high frequency introducing section at 9 mm. Glow discharge was induced in the deposition chamber in the semiconductor formation vacuum vessel 212 to form a 1 μm silicon-based film on the conductive substrate 204. At this time, high frequency of 60 MHz was introduced into the semiconductor formation vacuum vessel 212 through the high frequency introducing section 242, composed of a metal electrode made of Al, while adjusting the power density to 400 mW/cm$^3$ (Sample 1-1). Silicon-based films were similarly formed while varying the ratio of the source gas (Samples 1-2, 1-3, 1-4 and 1-5).

Then, high frequency from a high frequency power supply 253 was introduced into the high frequency introducing section 243 in semiconductor formation vacuum vessel 213, and the height adjusting mechanism was used to set the distance between the conductive substrate and the high frequency introducing section at 9 mm. Glow discharge was induced in the deposition chamber in the semiconductor formation vacuum vessel 213 to form a 1 μm silicon-based film on the conductive substrate 204. Formation conditions are shown in the formation conditions for 213 in Table 3. At this time, high frequency of 60 MHz was introduced into the semiconductor formation vacuum vessel 213 through the high frequency introducing section 243, composed of a metal electrode made of Al, while adjusting the power density to 300 mW/cm$^3$ (Sample 1-6).

The diffraction peak of each formed silicon-based film was measured using the X-ray diffracting apparatus. The results of measurements of Samples 1-1 to 1-5 are shown in Table 16. Three of these samples, i.e. Samples 1-2, 1-3 and 1-4 had a (220) face diffraction intensity of 0.50 or more and 0.60 or less and a (311) face diffraction intensity of 0.25 or more and 0.35 or less when the diffraction intensity of the (111) face was set to 1.

Further, the silicon-based film of Sample 1-6 had the highest diffraction intensity at the (220) face. Further, the (220) face diffraction intensity occupied 90% of the sum of the diffraction intensities of 11 reflections starting with the smallest angle, indicating that the silicon-based film of Sample 1-6 was preferentially oriented along the (110) face.

Then, a photovoltaic element was produced. A source gas and a diluting gas were supplied to the semiconductor formation vacuum vessels 211, 212, 213 and 215 through the gas introducing pipes 231, 232, 233 and 235, while operating the evacuation system. The discharge chambers in the semiconductor formation vacuum vessels 212 and 213 each had a longitudinal length of 1 m and a transverse width of 50 cm. Further, the semiconductor formation vacuum vessels other than the ones 211, 212, 213 and 215 were supplied with 200-cm$^3$/min (normal) H$_2$ gas through the gas introducing pipes, while simultaneously each gas gate was supplied with 500-cm$^3$/min (normal) H$_2$ gas through gate gas supply pipes (not shown in the drawings) as gate gas. Under these conditions, the exhaust performance of the evacuation system was regulated to adjust the pressures in the semiconductor formation vacuum vessels 211, 212, 213 and 215 to predetermined values. Photovoltaic elements were formed by setting the conditions for the semiconductor formation vacuum vessel 212 in five manners as shown in Table 1. The formation conditions other than those for the semiconductor formation vacuum vessel 212 are shown in Table 17.

Once the pressures in the semiconductor formation vacuum vessels 211, 212, 213 and 215 were stabilized, the conductive substrate 204 started to be moved from the substrate feeding vessel 202 toward the substrate wind-up vessel 203.

Then, high frequency from the high frequency power supplies 251, 252, 253 and 255 was introduced into the high frequency introducing sections 241, 242, 243 and 245 in the semiconductor formation vacuum vessels 211, 212, 213 and 215. Glow discharge was induced in the deposition chambers in the semiconductor formation vacuum vessels 211, 212, 213 and 215 to form on the conductive substrate 204 an amorphous n-type semiconductor layer (film thickness: 30 nm), an i-type semiconductor layer (film thickness: 1.5 μm), and a microcrystalline p-type semiconductor layer (film thickness: 10 nm), thereby forming a photovoltaic element. The i-type semiconductor layer had a total film thickness of 1.5 μm, and the film forming region adjusting plates in the semiconductor formation vacuum vessels 212 and 213 were regulated to adjust the thickness of a silicon-based film formed in each semiconductor formation vacuum vessel, as shown in Table 18 (Comparative Examples 13-1 to 13-9 and Examples 13-1 to 13-12).

Then, high frequency power of frequency 13.56 MHz and power density 5 mW/cm$^3$ was introduced into the semiconductor formation vacuum vessel 211 through the high frequency introducing section 241, composed of a metal electrode made of Al. High frequency was introduced into the semiconductor formation vacuum vessels 212 and 213 as in the case with the above described silicon-based films. High frequency power of frequency 13.56 MHz and power density 30 mW/cm$^3$ was introduced into the semiconductor formation vacuum vessel 214 through the high frequency introducing section 244, composed of a metal electrode made of Al.

Then, the continuous module forming apparatus, not shown in the drawings, was used to form the formed belt-like photovoltaic elements into solar cell modules of 36×22 cm size.

The photoelectric conversion efficiencies of the solar cell modules produced as described above were measured using the solar simulator (AM 1.5, 100 mW/cm$^2$). Further, the adhesion between the conductive substrate and the semiconductor layer was examined using cross cut tape tests (interval between cuts: 1 mm, the number of squares: 100). The results are shown in Table 4.

Furthermore, when the cross sections of the photovoltaic elements of Examples 13-1 to 13-12 were observed using TEM, it was found that in the i-type semiconductor layer, the microcrystal located in a region formed by the semiconductor formation vacuum vessel 212 was spherical and that the microcrystal located in a region formed by the semiconductor formation vacuum vessel 213 was shaped like a column extending vertically relative to the substrate. The surface layer of each i-type semiconductor layer was preferentially oriented along the (110) face as shown in RHEED figures of samples of the photovoltaic elements, which had been formed up to the i-type semiconductor layer.

As is apparent from the above description, solar cell including the semiconductor element of the present invention has excellent characteristics. The characteristics were particularly excellent when a region without any orientation property had a thickness of 1.0 nm or more and 20 nm or less.

EXAMPLE 14

The deposited film forming apparatus 201, shown in FIG. 2, was used to form the photovoltaic element shown in FIG. 5 using the following procedure: FIG. 5 is a schematic sectional view showing an example of a photovoltaic element having the silicon-based film of the present invention. In this figure, members that are similar to those in FIG. 1 are denoted by the same reference numerals, and their description is omitted. The semiconductor layer of this photovoltaic element is composed of the amorphous n-type semiconductor layer 102-1A, the microcrystalline i-type semiconductor layer 102-2A, the amorphous silicon layer 102-10, and the microcrystalline p-type semiconductor layer 102-3A. That is, this photovoltaic element is composed of a so-called pin type single cell.

Then, high frequency from the high frequency power supplies 251 to 255 was introduced into the high frequency introducing sections 241 to 245 in the semiconductor formation vacuum vessels 211 to 215. Glow discharge was induced in the deposition chambers in the semiconductor formation vacuum vessels 211 to 215 to form on the conductive substrate 204 an amorphous n-type semiconductor layer (film thickness: 30 nm), a microcrystalline i-type semiconductor layer (film thickness: 1.5 μm), an amorphous silicon layer, and a microcrystalline p-type semiconductor layer (film thickness: 10 nm), thereby forming a photovoltaic element.

The conditions for the interior of the semiconductor formation vacuum vessels 211, 212, 213, and 215 were similar to those in Example 13-2, and the conditions for the interior of the semiconductor formation vacuum vessel 214 are shown in Table 5. Further, high frequency of 100 MHz was introduced into the semiconductor formation vacuum vessel 214 through the high frequency introducing section 245, composed of a metal electrode made of Al, while adjusting the power density to 100 mW/cm$^3$. Then, the film forming region adjusting plate in the semiconductor formation vacuum vessel 214 was used to form photovoltaic elements with the film thicknesses shown in Table 20. Next, the continuous module forming apparatus, not shown in the drawings, was used to form the formed belt-like photovoltaic elements into solar cell modules of 36×22 cm size (Examples 14-1, 14-2, 14-3, and 14-4).

The photoelectric conversion efficiencies of the solar cell modules produced as described above were measured using the solar simulator (AM 1.5, 100 mW/cm$^2$). Further, the solar cell modules, the initial photoelectric conversion efficiencies of which had previously been measured, were retained at 50° C. and then irradiated with solar simulator light of AM 1.5 and 100 mW/cm$^2$ for 500 hours. Subsequently, the photoelectric conversion efficiencies were measured again to examine changes in photoelectric conversion efficiency associated with the photodegradation test. The results are shown in Table 20.

As is apparent from the above description, solar cells including the semiconductor element of the present invention have excellent characteristics. The characteristics were particularly excellent when the amorphous silicon layer had a thickness of 30 nm or less.

EXAMPLE 15

The deposited film forming apparatus 201, shown in FIG. 2, was used to form the photovoltaic element shown in FIG. 4.

The formation method was similar to that in Example 13-2 except that SiF$_4$ gas was introduced into the semiconductor formation vacuum vessel 213 together with oxygen the amount of which is shown in Table 7. Then, the continuous module forming apparatus, not shown in the drawings, was used to form the formed belt-like photovoltaic elements into solar cell modules of 36×22 cm size (Examples 15-1, 15-2, 15-3 and 15-4).

The photoelectric conversion efficiencies of the solar cell modules produced as described above were measured using the solar simulator (AM 1.5, 100 mW/cm$^2$). Further, the solar cell modules, the initial photoelectric conversion efficiencies of which had previously been measured, were installed in a dark place at a temperature of 85° C. and a humidity of 85% and held there for 30 minutes. Then, 70 minutes were spent reducing the temperature down to −20° C., and then the solar cell modules were held there for 30 minutes. Then, 70 minutes were spent again returning the temperature and humidity to the initial values, i.e. 85° C. and 85%. This cycle was repeated 100 times and then the photoelectric conversion efficiencies were measured again to examine changes in photoelectric conversion efficiency associated with the temperature-humidity test. Further, the solar cell modules were subjected to SIMS measurements to evaluate the concentration of oxygen contained in the silicon-based film formed by the semiconductor formation vacuum vessel 213. The results are shown in Table 22.

Furthermore, when the cross sections of the solar cell modules were observed using TEM, it was found that in the i-type semiconductor layer, the microcrystal located in a region formed by the semiconductor formation vacuum vessel 212 was spherical and that the microcrystal located in a region formed by the semiconductor formation vacuum vessel 213 was shaped like a column extending vertically relative to the substrate. It has been found that the substantially columnar shapes of the solar cell modules of Examples 15-1, 15-2 and 15-3 have a better uniformity in size than those of Examples 13-2 and 15-4.

As is apparent from the above description, solar cells including the semiconductor element of the present invention have excellent characteristics. The characteristics were particularly excellent when the film had an oxygen concentration of 1.5×10$^{18}$ atoms/cm$^3$ or more and 5.0×10$^{19}$ atoms/cm$^3$ or less.

EXAMPLE 16

The deposited film forming apparatus 201, shown in FIG. 2, was used to form the photovoltaic element shown in FIG. 4.

The formation method was similar to that in Example 13-2 except that the source gas shown in Table 9 was introduced into the semiconductor formation vacuum vessel 213. Then, the continuous module forming apparatus, not shown in the drawings, was used to form the formed belt-like photovoltaic elements into solar cell modules of 36×22 cm size (Examples 16-1, 16-2, 16-3, 16-4 and 16-5).

The photoelectric conversion efficiencies of the solar cell modules produced as described above were measured using the solar simulator (AM 1.5, 100 mW/cm$^2$). Further, the solar cell modules, the initial photoelectric conversion efficiencies of which had previously been measured, were installed in a dark place at a temperature of 85° C. and a humidity of 85% and held there for 30 minutes. Then, 70 minutes were spent reducing the temperature down to −20° C., and then the solar cell modules were held there for 30 minutes. Then, 70 minutes were spent again returning the temperature and humidity to the initial values, i.e. 85° C. and 85%. This cycle was repeated 100 times and then the photoelectric conversion efficiencies were measured again to examine changes in photoelectric conversion efficiency associated with the temperature-humidity test. Further, the solar cell modules were subjected to SIMS measurements to evaluate the concentration of fluorine contained in the silicon-based film formed by the semiconductor formation vacuum vessel 213. The results are shown in Table 23.

As is apparent from the above description, solar cells including the semiconductor element of the present invention have excellent characteristics. The characteristics were particularly excellent when the film had a fluorine concentration of 1.0×10$^{19}$ atoms/cm$^3$ or more and 2.5×10$^{20}$ atoms/cm$^3$ or less.

EXAMPLE 17

The deposited film forming apparatus 201, shown in FIG. 2, was used to form the photovoltaic element shown in FIG. 4.

The formation method was similar to that in Example 14-2 except that when an i-type semiconductor layer was formed in the semiconductor formation vacuum vessel 213, transportation of the conductive substrate was stopped and the flow rate ratio of gas introduced into the semiconductor formation vacuum vessel 213 was varied as shown in Table 24, while varying the (220) orientation property so that this orientation becomes gradually large in the film formation direction. In this case, the flow rate of each gas was linearly varied from the start to end of film formation. Then, the continuous module forming apparatus, not shown in the drawings, was used to form the formed belt-like photovoltaic element into a solar cell module of 36×22 cm size (Example 17).

The photoelectric conversion efficiency of the solar cell module produced as described above was measured using the solar simulator (AM 1.5, 100 mW/cm$^2$). It has been found that the solar cell module of Example 17 has a photoelectric conversion efficiency 1.15 times as high as that of Example 14-2.

As is apparent from the above description, solar cells including the semiconductor element of the present invention have excellent characteristics.

EXAMPLE 18

The deposited film forming apparatus 201, shown in FIG. 6, was used to form the photovoltaic element shown in FIG. 4.

The formation method was similar to that in Example 14-2 except that the two gas introducing pipes (233-1 and 233-2) were connected to the interior of the semiconductor formation vacuum vessel 213, the gas introducing pipe 233-1 was arranged upstream of the gas introducing pipe 233-2 in the direction in which the conductive substrate was transported, while changing the flow rate ratio of the source gas flowing through the gas introducing pipes as shown in Table 25 so that the density of the activated species in the plasma of the semiconductor formation vacuum vessel 213 varies in the direction in which the conductive substrate was transported. The formed belt-like photovoltaic element was formed into a solar cell module of 36×22 cm size (Example 18).

The photoelectric conversion efficiency of the solar cell module produced as described above was measured using the solar simulator (AM 1.5, 100 mW/cm$^2$). It has been found that the solar cell module of Example 18 has a photoelectric conversion efficiency 1.10 times as high as that of Example 14-2.

As is apparent from the above description, solar cells including the semiconductor element of the present invention have excellent characteristics.

EXAMPLE 19

The deposited film forming apparatus 201, shown in FIG. 2, was used to form the photovoltaic element shown in FIG. 4.

The formation method was similar to that in Example 14-2 except that the temperature of the lamp heater in the semiconductor formation vacuum vessel 213 was adjusted so that the temperature in the semiconductor formation vacuum vessel 213 was high at the start of film formation (i.e. at an upstream location in the transportation direction) and low at the end of film formation (i.e. at a downstream location in the transportation direction). The formation conditions in the semiconductor formation vacuum vessel 213 are shown in Table 26. The formed belt-like photovoltaic element was formed into a solar cell module of 36×22 cm size (Example 19).

The photoelectric conversion efficiency of the solar cell module produced as described above was measured using the solar simulator (AM 1.5, 100 mW/cm$^2$). It has been found that the solar cell module of Example 19 has a photoelectric conversion efficiency 1.30 times as high as that of Example 14-2.

As is apparent from the above description, solar cells including the semiconductor element of the present invention have excellent characteristics.

EXAMPLE 20

The deposited film forming apparatus 201, shown in FIG. 2, was used to form the photovoltaic element shown in FIG. 4.

The formation method was similar to that in Example 14-2 except that the height adjusting mechanisms in the semiconductor formation vacuum vessels 212 and 213 were used to vary the distance between the conductive substrate and the high frequency introducing section as shown in Table 27. The formed belt-like photovoltaic elements were formed into solar cell modules of 36×22 cm size.

The photoelectric conversion efficiencies of the solar cell modules produced as described above were measured using the solar simulator (AM 1.5, 100 mW/cm$^2$). The results are shown in Table 27. An i-type semiconductor layer obtained by setting the above distance at 2 mm had a nonuniform thickness and caused the photoelectric conversion efficiency to significantly vary among the solar cell modules. Solar cell modules obtained by setting the distance between the conductive substrate and the high frequency introducing section at 3 mm or more and 30 mm or less had high photoelectric conversion efficiencies.

As is apparent from the above description, solar cells including the semiconductor element of the present invention have excellent characteristics.

EXAMPLE 21

The deposited film forming apparatus 201, shown in FIG. 2, was used to form the photovoltaic element shown in FIG. 4.

The formation method was similar to that in Example 14-2 except that the pressure in the semiconductor formation vacuum vessel 213 was varied as shown in Table 28. The formed belt-like photovoltaic elements were formed into solar cell modules of 36×22 cm size.

The photoelectric conversion efficiencies of the solar cell modules produced as described above were measured using the solar simulator (AM 1.5, 100 mW/cm$^2$). Further, the adhesion between the conductive substrate and the semiconductor layer was examined using cross cut tape tests (interval between cuts: 1 mm, the number of squares: 100). Furthermore, the solar cell modules, the initial photoelectric conversion efficiencies of which had previously been measured, were installed in a dark place at a temperature of 85° C. and a humidity of 85% and held there for 30 minutes. Then, 70 minutes were spent reducing the temperature down to −20° C., and then the solar cell modules were held there for 30 minutes. Then, 70 minutes were spent again returning the temperature and humidity to the initial values, i.e. 85° C. and 85%. This cycle was repeated 100 times and then the photoelectric conversion efficiencies were measured again to examine changes in photoelectric conversion efficiency associated with the temperature-humidity test. The results are shown in Table 28.

Table 28 indicates that solar cell modules including photovoltaic elements produced by setting the pressure in the semiconductor formation vacuum vessel 213 at 90 Pa or more and 15,000 Pa or less have a high photoelectric conversion efficiency and show high performance in peel-off tests and temperature-humidity tests. In particular, solar cell modules including photovoltaic elements produced by setting the pressure at 100 Pa or more and 5,000 Pa or less show excellent characteristics in peel-off tests. As is apparent from the above description, solar cell modules including the semiconductor element of the present invention have excellent characteristics.

EXAMPLE 22

The deposited film forming apparatus 201, shown in FIG. 2, was used to form the photovoltaic element shown in FIG. 4.

The formation method was similar to that in Example 14-2 except that the residence time in semiconductor formation vacuum vessels 212 and 213 was varied as shown in Table 29. The formed belt-like photovoltaic elements were formed into solar cell modules of 36×22 cm size.

Table 29 indicates that solar cell modules including photovoltaic elements produced by setting the residence time in the semiconductor formation vacuum vessel 212 at 0.1 second or more and 10 seconds or less have a high photoelectric conversion efficiency, show high performance in peel-off tests and temperature-humidity tests, and have a low photodegradation rate. In particular, solar cell modules including photovoltaic elements produced by setting the residence time at 0.2 second or more and 3.0 seconds or less show excellent characteristics in peel-off tests. As is apparent from the above description, solar cell modules including the semiconductor element of the present invention have excellent characteristics.

EXAMPLE 23

The deposited film forming apparatus 201, shown in FIG. 2, was used to form the photovoltaic element shown in FIG. 5 using the following procedure: FIG. 7 is a schematic sectional view showing an example of a photovoltaic element having the silicon-based film of the present invention. In this figure, members that are similar to those in FIG. 1 are denoted by the same reference numerals, and their description is omitted. The semiconductor layer of this photovoltaic element is composed of the amorphous n-type semiconductors layers 102-1A and 102-4, the microcrystalline i-type semiconductor layer 102-2A, the amorphous i-type semiconductor layer 102-5, the amorphous silicon layer 102-10, and the microcrystalline p-type semiconductor layers 102-3A and 102-6. That is, this photovoltaic element is composed of a so-called pinpin type double cell.

As in Example 13, the belt-like conductive substrate 204 was produced and installed in the deposited film forming apparatus 201, and the substrate feeding vessel 202, the semiconductor formation vacuum vessels 211, 212, 213, 214, 215, 216, 217, and 218, and the substrate wind-up vessel 203 were sufficiently evacuated down to 6.7×10$^{-4}$ Pa (5×10$^{-6}$ Torr) or less using the evacuation system composed of the vacuum pump, not shown in the drawings.

Then, a source gas and a diluting gas were supplied to the semiconductor formation vacuum vessels 211 to 218 through the gas introducing pipes 231 to 238 while operating the evacuation system. The discharge chambers in the semiconductor formation vacuum vessels 212 and 213 each had a longitudinal length of 1 m and a transverse width of 50 cm. The gas gates were supplied with 500-cm$^3$/min (normal) H$_2$ gas through gate gas supply pipes (not shown in the drawings) as gate gas. Under these conditions, the exhaust performance of the evacuation system was regulated to adjust the pressures in the semiconductor formation vacuum vessels 211 to 216 to predetermined values. Formation conditions for the semiconductor formation vacuum vessels 211 to 215 were similar to those in Example 14-2. Formation conditions for the semiconductor formation vacuum vessels 216 to 218 are shown in Table 16.

Once the pressures in the semiconductor formation vacuum vessels 211 to 218 were stabilized, the conductive substrate 204 started to be moved from the substrate feeding vessel 202 toward the substrate wind-up vessel 203.

Then, high frequency from the high frequency power supplies 251 to 258 was introduced into the high frequency introducing sections 241 to 248 in the semiconductor formation vacuum vessels 211 to 218. Glow discharge was induced in the deposition chambers in the semiconductor formation vacuum vessels 211 to 218 to form on the conductive substrate 204 an amorphous n-type semiconductor layer (film thickness: 30 nm), a microcrystalline i-type semiconductor layer (film thickness: 2.0 μm), a microcrystalline p-type semiconductor layer (film thickness: 10 nm), an amorphous n-type semiconductor layer (film thickness: 30 nm), an amorphous i-type semiconductor layer (film thickness: 300 nm), and a microcrystalline p-type semiconductor layer (film thickness: 10 nm), thereby forming a photovoltaic element. A 10-nm thick microcrystal i-type semiconductor layer was formed in the semiconductor formation vacuum vessel 212. Then, high frequency power of frequency 13.56 MHz and power density 5 mW/cm$^3$ was introduced into the semiconductor formation vacuum vessels 211 and 216 through the high frequency introducing sections 241 and 246, composed of metal electrodes made of Al. High frequency of 60 MHz was introduced into the semiconductor formation vacuum vessel 212 through the high frequency introducing section 242, composed of a metal electrode made of Al, while adjusting the power density to 400 mW/cm$^3$. High frequency of 60 MHz was introduced into the semiconductor formation vacuum vessel 213 through the high frequency introducing section 243, composed of a metal electrode made of Al, while adjusting the power density to 300 mW/cm$^3$. High frequency of 100 MHz was introduced into the semiconductor formation vacuum vessels 214 and 217 through the high frequency introducing sections 244 and 247, composed of metal electrodes made of Al, while adjusting the power density to 100 mW/cm$^3$. High frequency power of frequency 13.56 MHz and power density 30 mW/cm$^3$ was introduced into the semiconductor formation vacuum vessels 215 and 218 through the high frequency introducing sections 245 and 248, composed of metal electrodes made of Al. Then, the continuous module forming apparatus, not shown in the drawings, was used to form the formed belt-like photovoltaic element into a solar cell module of 36×22 cm size.

When the photoelectric conversion efficiency of the solar cell module produced as described above was measured using the solar simulator (AM 1.5, 100 mW/cm$^2$), this solar cell module had a photoelectric conversion efficiency 1.2 times as high as a single solar cell module of Example 2-2. Further, this solar cell module showed high performance in peel-off tests and temperature-humidity tests, indicating that solar cell modules including the semiconductor element of the present invention have excellent characteristics.

EXAMPLE 24

An inverse staggered TFT was formed using the following procedure. FIG. 8 is a schematic sectional view showing an example of an inverse staggered TFT having the semiconductor element of the present invention. As an insulating substrate, the glass substrate 301 is used, on which the gate electrode 302 is formed. Furthermore, on the gate electrode 302 are formed the gate insulating film 303, the activated layer 304 composed of an undoped silicon layer, the Ohmic contact layer 305 arranged in a source-drain region on the activated layer 304 and composed of n$^+$-type amorphous silicon having a small resistance, and the source-drain electrode 306.

First, an Mo—Ta alloy film layer was formed on the glass substrate 301 by a sputtering process and then patterned to form the gate electrode 302. Then, using a CVD process, the gate insulating film 303, composed of a silicon oxide film, was formed. Subsequently, the glass substrate was set in the semiconductor formation vacuum vessel 212 shown in FIG. 2, and then a 15-nm silicon-based film without any orientation property was formed under the conditions for Sample 1-3. Then, the glass substrate was set in the semiconductor formation vacuum vessel 213, and a 65-nm silicon-based film preferentially oriented along the (110) face was formed under the conditions for Sample 1-6, thus obtaining the activated layer 304, having a thickness of 80 nm. Then, the glass substrate was set in the semiconductor formation vacuum vessel 211, and the Ohmic contact layer 305, composed of n$^+$-type amorphous silicon, was deposited and patterned through a lithography process. Furthermore, a metal film was formed and patterned to form the source-drain electrode 306. Finally, a mixed gas of CF$_4$ and O$_2$ was used to etch the Ohmic contact layer 305, exposed from the source-drain electrode 306, to form a TFT (Example 24).

A TFT was formed similarly to Example 24 except that the activated layer 304 was formed of an amorphous silicon layer so as to have a thickness of 80 nm (Comparative Example 24-1).

A TFT was formed similarly to Example 24 except that the activated layer 304 was formed only of a silicon-based film without any orientation property, so as to have a thickness of 80 nm (Comparative Example 24-2).

When the Ohmic contact layer 305 was etched, in the TFT of Example 24, the activated layer 304 was not overetched, whereas in the TFTs of the comparative examples, it was overetched, and was thus thinner and had a nonuniform film thickness. In particular, the TFT of Comparative Example 24-1 was significantly overetched. Further, the etching damage resulted in the formation of a leak path in the activated layer, thus increasing the value of off current compared to Example 24.

As is apparent from the above description, TFTs including the semiconductor element of the present invention have excellent characteristics.

As described above, the inventors have found that the present invention enables the inexpensive formation of a semiconductor element having good electrical characteristics and excellent adhesion and environment resistance.

TABLE 15

| Formation conditions for 212 | Source gas | (Sample 1-1) SiH$_4$: SiF$_4$: H$_2$ = 2:1:10 τ = 0.3 second |
| --- | --- | --- |
| | | (Sample 1-2) SiH$_4$: SiF$_4$: H$_2$ = 2:2:10 τ = 0.3 second |
| | | (Sample 1-3) SiH$_4$: SiF$_4$: H$_2$ = 2:3:10 τ = 0.4 second |
| | | (Sample 1-4) SiH$_4$: SiF$_4$: H$_2$ = 2:4:10 τ = 0.4 second |
| | | (Sample 1-5) SiH$_4$: SiF$_4$: H$_2$ = 2:5:10 τ = 0.4 second |
| | Substrate temperature | 300° C. |
| | Pressure | 200 Pa (1.5 Torr) |

TABLE 16

| Sample | (111) diffraction intensity | (220) diffraction intensity | (311) diffraction intensity |
| --- | --- | --- | --- |
| Sample 1-1 | 1 | 0.45 | 0.40 |
| Sample 1-2 | 1 | 0.50 | 0.35 |
| Sample 1-3 | 1 | 0.52 | 0.31 |
| Sample 1-4 | 1 | 0.60 | 0.25 |
| Sample 1-5 | 1 | 0.65 | 0.10 |

TABLE 17

| | | |
|---|---|---|
| Formation conditions for 211 | Source gas | SiH$_4$: 20 cm$^3$/min (normal)<br>H$_2$: 100 cm$^3$/min (normal)<br>PH$_3$ (Diluted to 2% with H$_2$): 30 cm$^3$/min (normal) |
| | Substrate temperature | 300° C. |
| | Pressure | 133 Pa (1.0 Torr) |
| Formation conditions for 213 | Source gas | SiH$_4$: SiF$_4$: H$_2$ = 1:5:15<br>τ = 0.4 second |
| | Substrate temperature | 350° C. |
| | Pressure | 200 Pa (1.5 Torr) |
| Formation conditions for 215 | Source gas | SiH$_4$: 10 cm$^3$/min (normal)<br>H$_2$: 800 cm$^3$/min (normal)<br>BF$_3$ (Diluted to 2% with H$_2$): 100 cm$^3$/min (normal) |
| | Substrate temperature | 200° C. |
| | Pressure | 160 Pa (1.2 Torr) |

TABLE 18

| | Formation conditions in 212 | Film thickness in 212 (nm) | Photoelectric conversion efficiency | Peel-off tests |
|---|---|---|---|---|
| Comparative Example 13-1 | Sample 1 | 0 | 1 | B |
| Comparative Example 13-2 | Sample 1 | 1.0 | 1.01 | B |
| Comparative Example 13-3 | Sample 1 | 10 | 1.02 | B |
| Comparative Example 13-4 | Sample 1 | 20 | 1.03 | B |
| Comparative Example 13-5 | Sample 1 | 50 | 1.00 | B |
| Example 13-1 | Sample 2 | 1.0 | 1.30 | AA |
| Example 13-2 | Sample 2 | 10 | 1.35 | AA |
| Example 13-3 | Sample 2 | 20 | 1.30 | AA |
| Example 13-4 | Sample 2 | 50 | 1.25 | A |
| Example 13-5 | Sample 3 | 1.0 | 1.32 | AA |
| Example 13-6 | Sample 3 | 10 | 1.35 | AA |
| Example 13-7 | Sample 3 | 20 | 1.33 | AA |
| Example 13-8 | Sample 3 | 50 | 1.30 | A |
| Example 13-9 | Sample 4 | 1.0 | 1.34 | AA |
| Example 13-10 | Sample 4 | 10 | 1.33 | AA |
| Example 13-11 | Sample 4 | 20 | 1.35 | AA |
| Example 13-12 | Sample 4 | 50 | 1.30 | A |
| Comparative Example 13-6 | Sample 5 | 1.0 | 1.02 | B |
| Comparative Example 13-7 | Sample 5 | 10 | 1.05 | B |
| Comparative Example 13-8 | Sample 5 | 20 | 1.04 | B |
| Comparative Example 13-9 | Sample 5 | 50 | 1.02 | B |

The photoelectric conversion efficiencies have been standardized by setting the value for Comparative Example 13-1 to 1. For the peel-off tests, the symbols AA, A, B and C indicate that the number of peeled-off squares is 0, 1 to 2, 3 to 10 and 10 to 100, respectively.

TABLE 19

| | | |
|---|---|---|
| Formation conditions for 214 | Source gas | SiH$_4$: 200 cm$^3$/min (normal)<br>H$_2$: 1000 cm$^3$/min (normal) |
| | Substrate temperature | 300° C. |
| | Pressure | 1000 Pa (7.5 Torr) |

TABLE 20

| | Example 14-1 | Example 14-2 | Example 14-3 | Example 14-4 |
|---|---|---|---|---|
| Thickness of film formed in 214 (nm) | 0 | 10 | 30 | 50 |
| Photoelectric conversion efficiency | 1 | 1.12 | 1.17 | 1.15 |
| Photodegradation rate | 1 | 1.03 | 1.02 | 1.20 |

The photodegradation rates have been standardized by setting the value for Example 14-1 to 1.

TABLE 21

| | |
|---|---|
| SiF$_4$ Gas (Example 15-1) | SiF$_4$ introduced with 0.1-ppm oxygen |
| SiF$_4$ Gas (Example 15-2) | SiF$_4$ introduced with 0.3-ppm oxygen |
| SiF$_4$ Gas (Example 15-3) | SiF$_4$ introduced with 0.7-ppm oxygen |
| SiF$_4$ Gas (Example 15-4) | SiF$_4$ introduced with 1.0-ppm oxygen |

TABLE 22

| | Example 13-2 | Example 15-1 | Example 15-2 | Example 15-3 | Example 15-4 |
|---|---|---|---|---|---|
| Concentration of oxygen in film (atoms/cm$^3$) | $1.0 \times 10^{18}$ | $1.5 \times 10^{18}$ | $7.0 \times 10^{18}$ | $5.0 \times 10^{19}$ | $7.0 \times 10^{19}$ |
| Initial photoelectric conversion efficiency | 1 | 1.12 | 1.13 | 1.15 | 1.05 |
| Changes of photoelectric conversion efficiency in temperature-humidity test (Efficiency after test/initial efficiency) | 0.98 | 1.0 | 1.0 | 1.0 | 0.95 |

TABLE 23

| | Example 16-1 | Example 16-2 | Example 16-3 | Example 16-4 | Example 16-5 |
|---|---|---|---|---|---|
| Source gas for 213 SiH$_4$: SiF$_4$: H$_2$ | 1:1:15 | 1:2:15 | 1:3:15 | 1:4:15 | 1:5:15 |
| τ (second) | 0.8 sec | 0.8 sec | 0.8 sec | 0.8 sec | 0.8 sec |
| Concentration of fluorine in thin film (atoms/cm$^3$) | $7.5 \times 10^{18}$ | $1.0 \times 10^{19}$ | $8.0 \times 10^{16}$ | $2.5 \times 10^{20}$ | $5.0 \times 10^{20}$ |
| Initial photoelectric efficiency | 1 | 1.15 | 1.20 | 1.15 | 1.05 |
| Changes of photoelectric conversion | 0.95 | 1.0 | 1.0 | 1.0 | 0.98 |

TABLE 23-continued

|  | Example 16-1 | Example 16-2 | Example 16-3 | Example 16-4 | Example 16-5 |
|---|---|---|---|---|---|
| efficiency in temperature-humidity test (Efficiency after test/ initial efficiency) | | | | | |

TABLE 24

| Formation conditions for 213 | Source gas | At start of film formation: $SiH_4$: $SiF_4$: $H_2$ = 1:3:10, τ = 0.4 second<br>At end of film formation: $SiH_4$: $SiF_4$: $H_2$ = 1:5:15, τ = 0.4 second |
|---|---|---|
| | Substrate temperature | 350° C. |
| | Pressure | 200 Pa (1.5 Torr) |

TABLE 25

| Formation conditions for 213 | Source gas | 233-1: $SiH_4$: $SiF_4$: $H_2$ = 1:3:10<br>233-2: $SiF_4$: $H_2$ = 1:4<br>τ = 0.4 second |
|---|---|---|
| | Substrate temperature | 350° C. |
| | Pressure | 200 Pa (1.5 Torr) |

TABLE 26

| Formation conditions for 213 | Source gas | $SiH_4$: $SiF_4$: $H_2$ = 1:5:15<br>τ = 0.4 second |
|---|---|---|
| | Substrate temperature | 350° C. (at start of film formation) → 250° C. (at end of film formation) |
| | Pressure | 200 Pa (1.5 Torr) |

TABLE 27

| Distance between conductive substrate and high frequency introducing section (mm) | 2 | 3 | 6 | 9 | 15 | 30 | 50 |
|---|---|---|---|---|---|---|---|
| Photoelectric conversion efficiency | — | 1 | 1.03 | 1.07 | 1.10 | 1.10 | 0.7 |

The values have been standardized by setting the value obtained when the distance between the conductive substrate and the high frequency introducing section is 3 mm, to 1.

TABLE 28

| Pressure in semiconductor formation vessel 213 (Pa) | 50 | 90 | 100 | 1000 | 5000 | 10000 | 15000 | 20000 |
|---|---|---|---|---|---|---|---|---|
| Photoelectric conversion efficiency | 1 | 1.20 | 1.38 | 1.42 | 1.50 | 1.45 | 1.35 | 0.9 |
| Peel-off tests | C | A | AA | AA | AA | A | A | B |
| Temperature-humidity tests | 0.70 | 0.90 | 1.0 | 1.0 | 1.0 | 0.95 | 0.9 | 0.75 |

The photoelectric conversion efficiencies have been standardized by setting the value obtained when the pressure in the semiconductor formation vacuum vessel 213 is 50 Pa, to 1. For the peel-off tests, the symbols AA, A, B and C indicate that the number of peeled-off squares is 0, 1 to 2, 3 to 10 and 10 to 100, respectively. The results of the temperature-humidity tests show the values of (photoelectric conversion efficiency after the test)/(photoelectric conversion efficiency before the test).

TABLE 29

| Residence time (second) in semiconductor formation vessels 212 and 213 | 0.008 | 0.01 | 0.1 | 1.0 | 3.0 | 10 | 15 |
|---|---|---|---|---|---|---|---|
| Photoelectric conversion efficiency | 1 | 1.45 | 1.50 | 1.60 | 1.55 | 1.35 | 0.80 |
| Peel-off tests | B | A | AA | AA | AA | A | C |
| Temperature-humidity tests | 0.7 | 0.9 | 1.0 | 1.0 | 1.0 | 1.0 | 0.7 |

The photoelectric conversion efficiencies have been standardized by setting the value obtained when the residence time in the semiconductor formation vacuum vessels 212 and 213 is 0.008 second, to 1. For the peel-off tests, the symbols AA, A, B and C indicate that the number of peeled-off squares is 0, 1 to 2, 3 to 10 and 10 to 100, respectively. The results of the temperature-humidity tests show the values of (photoelectric conversion efficiency after the test)/(photoelectric conversion efficiency before the test).

TABLE 30

| Formation conditions for 216 | Source gas | $SiH_4$: 20 cm³/min (normal)<br>$H_2$: 100 cm³/min (normal)<br>$PH_3$ (Diluted to 2% with $H_2$) 50 cm³/min (normal) |
|---|---|---|
| | Substrate temperature | 300° C. |
| | Pressure | 133 Pa (1.0 Torr) |
| Formation conditions for 217 | Source gas | $SiH_4$: 300 cm³/min (normal)<br>$H_2$: 4000 cm³/min (normal) |
| | Substrate temperature | 300° C. |
| | Pressure | 1500 Pa (11.3 Torr) |
| Formation conditions for 218 | Source gas | $SiH_4$: 10 cm³/min (normal)<br>$H_2$: 800 cm³/min (normal)<br>$BF_3$ (Diluted to 2% with $H_2$): 100 cm³/min (normal) |
| | Substrate temperature | 200° C. |
| | Pressure | 160 Pa (1.2 Torr) |

What is claimed is:

1. A semiconductor element comprising a semiconductor junction composed of silicon-based films, wherein at least one of the silicon-based films contains a microcrystal, and an orientation property of the microcrystal in the silicon-based film containing the microcrystal changes in a film thickness direction of the silicon-based film containing the microcrystal.

2. The semiconductor element according to claim 1, wherein the semiconductor element is a photovoltaic element including at least one pin type semiconductor junction having a semiconductor layer exhibiting a first conductivity type, i-type semiconductor layers, and a semiconductor layer exhibiting a second conductivity type, the layers being mainly composed of silicon atoms and sequentially stacked on a substrate, wherein one of the i-type semiconductor layers includes the silicon-based film containing the microcrystal.

3. The semiconductor element according to claim 2, wherein an amorphous silicon layer is arranged between the silicon-based film containing the microcrystal and the semiconductor layer exhibiting the first or second conductivity type which is arranged on a light incidence side relative to the silicon-based film containing the microcrystal.

4. The semiconductor element according to claim 3, wherein the amorphous silicon layer has a film thickness of 30 nm or less.

5. The semiconductor element according to claim 1, wherein the orientation property of the microcrystal changes so that the ratio of the diffraction intensity of a (220) face of the microcrystal, which is measured with X rays or electron rays, to the total diffraction intensity changes in the film thickness direction of the silicon-based film.

6. The semiconductor element according to claim 5, wherein the orientation property of the microcrystal changes so that the ratio of the diffraction intensity of the (220) face of the microcrystal in the silicon-based film containing the microcrystal, which is measured with X rays or electron rays, to the total diffraction intensity is relatively low in an initial stage of film formation.

7. The semiconductor element according to claim 1, wherein the orientation property of the microcrystal changes continuously.

8. The semiconductor element according to claim 1, wherein the silicon-based film containing the microcrystal includes a region in which the diffraction intensity of the (220) face of the microcrystal, which is measured with X rays or electron rays, occupies 80% or more of the total diffraction intensity.

9. The semiconductor element according to claim 1, wherein in the silicon-based film containing the microcrystal, the microcrystal which is preferentially oriented along a (220) face is shaped in a column extending in a vertical direction relative to a substrate on which the silicon-based films are stacked.

10. The semiconductor element according to claim 1, wherein a microcrystal located in an interface region of the silicon-based film containing the microcrystal is preferentially oriented along a (100) face.

11. The semiconductor element according to claim 10, wherein the microcrystal located in the interface region is shaped in substantially a sphere.

12. The semiconductor element according to claim 10 or 11, wherein a film thickness of the interface region is set to 1.0 nm or more and 20 nm or less.

13. The semiconductor element according to claim 1, wherein the silicon-based film containing the microcrystal contains at least one kind of oxygen atoms, carbon atoms and nitrogen atoms, and the total amount of the atoms is $1.5 \times 10^{18}$ atoms/cm$^3$ or more and $5.0 \times 10^{19}$ atoms/cm$^3$ or less.

14. The semiconductor element according to claim 1, wherein the silicon-based film containing the microcrystal contains $1.0 \times 10^{19}$ atoms/cm$^3$ or more and $2.5 \times 10^{20}$ atoms/cm$^3$ or less of fluorine atoms.

15. The semiconductor element according to claim 1, wherein the silicon-based film containing the microcrystal is formed by introducing a source gas containing at least one of a hydrogenated silicon gas and a fluorinated silicon gas, and hydrogen into a vacuum vessel, introducing high frequency into a high frequency introducing section in the vacuum vessel, and forming a silicon-based film on a substrate introduced into the vacuum vessel by a high frequency plasma CVD process.

16. The semiconductor element according to claim 15, wherein during the process of forming the silicon-based film containing the microcrystal, the flow rate ratio of the source gas is varied.

17. The semiconductor element according to claim 15, wherein during the process of forming the silicon-based film containing the microcrystal, the source gas is introduced into the vacuum vessel using a plurality of gas introducing sections, and the source gas flowing through at least one of the plurality of gas introducing sections has a flow rate ratio different from that in the other gas introducing sections.

18. The semiconductor element according to claim 15, wherein the high frequency is set to 10 MHz or more and 10 GHz or less.

19. The semiconductor element according to claim 18, wherein the high frequency is set to 20 MHz or more and 300 MHz or less.

20. The semiconductor element according to claim 15, wherein a distance between the high frequency introducing section and the substrate is set to 3 mm or more and 30 mm or less.

21. The semiconductor element according to claim 15, wherein a pressure under which the silicon-based film containing the microcrystal is formed is set to 100 Pa (0.75 Torr) or more and 5,000 Pa (37.5 Torr) or less.

22. The semiconductor element according to claim 15, wherein a residence time of the source gas during the formation of the silicon-based film containing the microcrystal is set to 0.01 second or more and 10 seconds or less.

23. The semiconductor element according to claim 22, wherein the residence time of the source gas during the formation of the silicon-based film containing the microcrystal is set to 0.1 second or more and 3 seconds or less.

24. A method of making a semiconductor element comprising a semiconductor junction composed of silicon-based films, at least one of the silicon-based films containing a microcrystal, the method comprising:
  forming the silicon-based film containing the microcrystal such that the orientation property of the microcrystal changes in a film thickness direction of the silicon-based film containing the microcrystal.

25. The method of making the semiconductor element according to claim 24, wherein the orientation property of the microcrystal changes so that the ratio of the diffraction intensity of a (220) face of the microcrystal, which is measured with X rays or electron rays to the total diffraction intensity changes in the film thickness direction of the silicon-based film.

26. The method of making the semiconductor element according to claim 25, wherein the orientation property of the microcrystal changes so that the ratio of the diffraction intensity of the (220) face of the microcrystal in the silicon-based film containing the microcrystal, which is measured with X rays or electron rays, to the total diffraction intensity is relatively low in an initial stage of film formation.

27. The method of making the semiconductor element according to claim 24, wherein the orientation property of the microcrystal changes continuously.

28. The method of making the semiconductor element according to claim 24, wherein the silicon-based film containing the microcrystal includes a region in which the diffraction intensity of the (220) face of the microcrystal, which is measured with X rays or electron rays, occupies 80% or more of the total diffraction intensity.

29. The method of making the semiconductor element according to claim 24, wherein in the silicon-based film containing the microcrystal, the microcrystal which is preferentially oriented along a (110) face is shaped in a column extending in a vertical direction relative to the substrate.

30. The method of making the semiconductor element according to claim 24, wherein the microcrystal located in an interface region of the silicon-based film containing the microcrystal is preferentially oriented along a (100) face.

31. The method of making the semiconductor element according to claim 24, wherein the microcrystal located in the interface region is shaped in substantially a sphere.

32. The method of making the semiconductor element according to claim 30 or 31, wherein a film thickness of the interface region is set to 1.0 nm or more and 20 nm or less.

33. The method of making the semiconductor element according to claim 24, wherein the silicon-based film containing the microcrystal contains at least one kind of oxygen atoms, carbon atoms and nitrogen atoms, and the total amount of the atoms is $1.5 \times 10^{18}$ atoms/cm$^3$ or more and $5.0 \times 10^{19}$ atoms/cm$^3$ or less.

34. The method of making the semiconductor element according to claim 24, wherein the silicon-based film containing the microcrystal contains $1.0 \times 10^{19}$ atoms/cm$^3$ or more and $2.5 \times 10^{20}$ atoms/cm$^3$ or less of fluorine atoms.

35. The method of making the semiconductor element according to claim 24, wherein the silicon-based film containing the microcrystal is formed by introducing source gas containing at least one of a hydrogenated silicon gas and a fluorinated silicon gas, and hydrogen into a vacuum vessel, introducing high frequency into a high frequency introducing section in the vacuum vessel, and forming a silicon-based film on a substrate introduced into the vacuum vessel by a high frequency plasma CVD process.

36. The method of making the semiconductor element according to claim 35, wherein during the process of forming the silicon-based film containing the microcrystal, the flow rate ratio of the source gas is varied.

37. The method of making the semiconductor element according to claim 35, wherein the source gas is introduced into the vacuum vessel using a plurality of gas introducing sections, and the source gas flowing through at least one of the plurality of gas introducing sections has a flow rate ratio different from that in the other gas introducing sections.

38. The method of making the semiconductor element according to claim 35, wherein the high frequency is set to 10 MHz or more and 10 GHz or less.

39. The method of making the semiconductor element according to claim 38, wherein the high frequency is set to 20 MHz or more and 300 MHz or less.

40. The method of making the semiconductor element according to claim 35, wherein the distance between the high frequency introducing section and the substrate is set to 3 mm or more and 30 mm or less.

41. The method of making the semiconductor element according to claim 35, wherein a pressure under which the silicon-based film containing the microcrystal is formed is set to 100 Pa (0.75 Torr) or more and 5,000 Pa (37.5 Torr) or less.

42. The method of making the semiconductor element according to claim 35, wherein a residence time of the source gas during the formation of the silicon-based film containing the microcrystal is set to 0.01 second or more and 10 seconds or less.

43. The method of making the semiconductor element according to claim 42, wherein the residence time of the source gas during the formation of the silicon-based film containing the microcrystal is set to 0.1 second or more and 3 seconds or less.

44. A semiconductor element comprising a semiconductor junction composed of silicon-based films, at least one of the silicon-based films containing a microcrystal, wherein the microcrystal is located in at least one interface region of the silicon-based film containing the microcrystal and has no orientation property, wherein the semiconductor element includes at least one pin type semiconductor junction having a semiconductor layer exhibiting a first conductivity type, i-type semiconductor layers, and a semiconductor layer exhibiting a second conductivity type, the layers being mainly composed of silicon atoms and sequentially stacked on a substrate, and wherein an amorphous silicon layer is arranged between the silicon-based film containing the microcrystal and the semiconductor layer exhibiting the first or second conductivity type which is arranged on a light incidence side relative to the silicon-based film containing the microcrystal.

45. The semiconductor element according to claim 44, wherein the amorphous silicon layer has a film thickness of 30 nm or less.

46. A semiconductor element comprising a semiconductor junction composed of silicon-based films, wherein at least one of the silicon-based films contains a microcrystal, and a microcrystal located in at least one interface region of the silicon-based film containing the microcrystal has no orientation property, and wherein in the silicon-based film containing the microcrystal, the ratio of the diffraction intensity of a (220) face of the microcrystal except for a non-orientation property region, which is measured with X rays or electron rays, to the total diffraction intensity changes in a film thickness direction of the silicon-based film.

47. A semiconductor element comprising a semiconductor junction composed of silicon-based films, wherein at least one of the silicon-based films contains a microcrystal, and a microcrystal located in at least one interface region of the silicon-based film containing the microcrystal has no orientation property, and wherein the orientation property of the microcrystal located in the interface region is such that when measured with X rays or electron rays, three diffraction faces (111), (220), and (311) arranged in this order from the small angle side have such diffraction intensities that when the (111) face has a diffraction intensity of 1, the (220) face has a diffraction intensity of 0.50 or more and 0.60 or less, whereas the (311) face has a diffraction intensity of 0.25 or more and 0.35 or less.

48. The semiconductor element according to claim 46, wherein the ratio of the diffraction intensity of the (220) face of the microcrystal in the silicon-based film containing the microcrystal, which is measured with X rays or electron rays, to the total diffraction intensity is relatively low in an initial stage of film formation.

49. The semiconductor element according to claim 46, wherein the orientation property of the microcrystal changes continuously.

50. A semiconductor element comprising a semiconductor junction composed of silicon-based films,
wherein at least one of the silicon-based films contains a microcrystal, and a microcrystal located in at least one interface region of the silicon-based film containing the microcrystal has no orientation property, and
wherein in the silicon-based film containing the microcrystal, a microcrystal which is preferentially oriented along the (220) face is shaped in a column extending in a vertical direction relative to the substrate.

51. A semiconductor element comprising a semiconductor junction composed of silicon-based films,
wherein at least one of the silicon-based films contains a microcrystal, and a microcrystal located in at least one interface region of the silicon-based film containing the microcrystal has no orientation property, and
wherein the microcrystal located in the interface region is shaped in substantially a sphere.

52. The semiconductor element according to claim 44, wherein a film thickness of the interface region is set to 1.0 nm or more and 20 nm or less.

53. The semiconductor element according to claim 44, wherein the silicon-based film containing the microcrystal contains at least one kind of oxygen atoms, carbon atoms and nitrogen atoms, and the total amount of the atoms is $1.5 \times 10^{18}$ atoms/cm$^3$ or more and $5.0 \times 10^{19}$ atoms/cm$^3$ or less.

54. The semiconductor element according to claim 44, wherein the silicon-based film containing the microcrystal contains $1.0 \times 10^{19}$ atoms/cm$^3$ or more and $2.5 \times 10^{20}$ atoms/cm$^3$ or less of fluorine atoms.

55. The semiconductor element according to claim 44, wherein the silicon-based film containing the microcrystal is formed by introducing a source gas containing at least one of a hydrogenated silicon gas and a fluorinated silicon gas, and hydrogen into a vacuum vessel, introducing high frequency into a high frequency introducing section in the vacuum vessel, and forming a silicon-based film on a substrate introduced into the vacuum vessel by a high frequency plasma CVD process.

56. The semiconductor element according to claim 55, wherein during the process of forming the silicon-based film containing the microcrystal, the flow rate ratio of the source gas is varied.

57. The semiconductor element according to claim 55, wherein the source gas is introduced into the vacuum vessel using a plurality of gas introducing sections, and the source gas flowing through at least one of the plurality of gas introducing sections has a flow rate ratio different from that in the other gas introducing sections.

58. The semiconductor element according to claim 55, wherein the high frequency is set to 10 MHz or more and 10 GHz or less.

59. The semiconductor element according to claim 58, wherein the high frequency is set to 20 MHz or more and 300 MHz or less.

60. The semiconductor element according to claim 55, wherein a distance between the high frequency introducing section and the substrate is set to 3 mm or more and 30 mm or less.

61. The semiconductor element according to claim 55, wherein a pressure under which the silicon-based film containing the microcrystal is set to formed is 100 Pa (0.75 Torr) or more and 5,000 Pa (37.5 Torr) or less.

62. The semiconductor element according to claim 55, wherein a residence time of the source gas during the formation of the silicon-based film containing the microcrystal is set to 0.01 second or more and 10 seconds or less.

63. The semiconductor element according to claim 62, wherein the residence time of the source gas during the formation of the silicon-based film containing the microcrystal is 0.1 second or more and 3 seconds or less.

64. The semiconductor element according to claim 55, wherein heating means used for the substrate in forming the silicon-based film containing the microcrystal is arranged opposite a surface of the substrate on which the silicon-based film containing the microcrystal is formed, and an output of the heating means decreases as the silicon-based film containing the microcrystal is formed.

65. A method of making a semiconductor element comprising a semiconductor junction composed of silicon-based films, at least one of the silicon-based films containing a microcrystal, the semiconductor element including at least one pin type semiconductor junction having a semiconductor layer exhibiting a first conductivity type, i-type semiconductor layers, and a semiconductor layer exhibiting a second conductivity type, the layers being mainly composed of silicon atoms and sequentially stacked on a substrate, and an amorphous silicon layer being arranged between the silicon-based film containing the microcrystal and the semiconductor layer exhibiting the first or second conductivity type which is arranged on a light incidence side relative to the silicon-based film containing the microcrystal, the method comprising:
forming the silicon-based film containing the microcrystal such that the microcrystal is located in at least one interface region of the silicon-based film containing the microcrystal and has no orientation property.

66. The method of making the semiconductor element according to claim 65, wherein in the silicon-based film containing the microcrystal, the ratio of the diffraction intensity of a (220) face of the microcrystal except for the non-orientation property region, which is measured with X rays or electron rays, to the total diffraction intensity changes in a film thickness direction of the silicon-based film.

67. The method of making the semiconductor element according to claim 65, wherein the orientation property of the microcrystal located in the interface region is such that when measured with X rays or electron rays, three diffraction faces (111), (220), and (311) arranged in this order from the small angle side have such diffraction intensities that when the (111) face has a diffraction intensity of 1, the (220) face has a diffraction intensity of 0.50 or more and 0.60 or less, whereas the (311) face has a diffraction intensity of 0.25 or more and 0.35 or less.

68. The method of making the semiconductor element according to claim 66, wherein the ratio of the diffraction intensity of the (220) face of the microcrystal in the silicon-based film containing the microcrystal, which is measured with X rays or electron rays, to the total diffraction intensity is made relatively low in an initial stage of film formation.

69. The method of making the semiconductor element according to claim 65, wherein the orientation property of the microcrystal changes continuously.

70. The method of making the semiconductor element according to claim 65, wherein the silicon-based film containing the microcrystal includes a region in which the diffraction intensity of the (220) face of the microcrystal, which is measured with X rays or electron rays occupies 80% or more of the total diffraction intensity.

71. The method of making the semiconductor element according to claim 65, wherein in the silicon-based film containing the microcrystal, a microcrystal which is preferentially oriented along the (220) face is shaped in a column extending in a vertical direction relative to the substrate.

72. The method of making the semiconductor element according to claim 65, wherein the microcrystal located in the interface region is shaped in substantially a sphere.

73. The method of making the semiconductor element according to claim 65, film thickness of the interface region is set to 1.0 nm or more and 20 nm or less.

74. The method of making the semiconductor element according to claim 65, wherein the silicon-based film containing the microcrystal contains at least one kind of oxygen atoms, carbon atoms and nitrogen atoms, and the total amount of the atoms is set to $1.5 \times 10^{18}$ atoms/cm$^3$ or more and $5.0 \times 10^{19}$ atoms/cm$^3$ or less.

75. The method of making the semiconductor element according to claim 65, wherein the silicon-based film containing the microcrystal contains $1.0 \times 10^{19}$ atoms/cm$^3$ or more and $2.5 \times 10^{20}$ atoms/cm$^3$ or less of fluorine atoms.

76. The method of making the semiconductor element according to claim 65, wherein the silicon-based film containing the microcrystal is formed by introducing source gas containing at least one of a hydrogenated silicon gas and a fluorinated silicon gas, and hydrogen into a vacuum vessel, introducing high frequency into a high frequency introducing section in the vacuum vessel, and forming a silicon-based film on a substrate introduced into the vacuum vessel by a high frequency plasma CVD process.

77. The method of making the semiconductor element according to claim 76, wherein during the process of forming the silicon-based film containing the microcrystal, the flow rate ratio of the source gas is varied.

78. The method of making the semiconductor element according to claim 76, wherein the source gas is introduced into the vacuum vessel using a plurality of gas introducing sections, and the source gas flowing through at least one of the plurality of gas introducing sections has a flow rate ratio different from that in the other gas introducing sections.

79. The method of making the semiconductor element according to claim 76, wherein the high frequency is set to 10 MHz or more and 10 GHz or less.

80. The method of making the semiconductor element according to claim 79, wherein the high frequency is set to 20 MHz or more and 300 MHz or less.

81. The method of making the semiconductor element according to claim 76, wherein a distance between the high frequency introducing section and the substrate is set to 3 mm or more and 30 mm or less.

82. The method of making the semiconductor element according to claim 76, wherein a pressure under which the silicon-based film containing the microcrystal is formed is set to 100 Pa (0.75 Torr) or more and 5,000 Pa (37.5 Torr) or less.

83. The method of making the semiconductor element according to claim 76, wherein a residence time of the source gas during the formation of the silicon-based film containing the microcrystal is set to 0.01 second or more and 10 seconds or less.

84. The method of making the semiconductor element according to claim 83, wherein the residence time of the source gas during the formation of the silicon-based film containing the microcrystal is set to 0.1 second or more and 3 seconds or less.

85. The method of making the semiconductor element according to claim 76, wherein heating means for the substrate in forming the silicon-based film containing the microcrystal is arranged opposite a surface of the substrate on which the silicon-based film containing the microcrystal is formed, and an output of the heating means decreases as the silicon-based film containing the microcrystal is formed.

* * * * *

UNITED STATES PATENT AND TRADEMARK OFFICE
CERTIFICATE OF CORRECTION

PATENT NO. : 6,858,308 B2
DATED : February 22, 2005
INVENTOR(S) : Takaharu Kondo et al.

It is certified that error appears in the above-identified patent and that said Letters Patent is hereby corrected as shown below:

Title page,
Item [56], References Cited, FOREIGN PATENT DOCUMENTS,
"11233803" should read -- 11-233803 --.

Column 1,
Line 13, "as an" should read -- as a --.

Column 16,
Line 24, "is may" should read -- may --.

Column 25,
Line 34, "semiconductors" should read -- semiconductor --.

Column 44,
Line 17, "The" should read -- The photoelectric conversion efficiencies and --.

Column 46,
Table 30, "with $H_2$)" should read -- with $H_2$): --.

Column 52,
Line 3, "set to formed is" should read -- formed is set to --.

Column 53,
Line 14, "claim 65," should read -- claim 65, wherein a --.

Signed and Sealed this

Fourteenth Day of February, 2006

JON W. DUDAS
*Director of the United States Patent and Trademark Office*